US012641769B2

(12) United States Patent
Chung et al.

(10) Patent No.: US 12,641,769 B2
(45) Date of Patent: May 26, 2026

(54) INTEGRATED CIRCUIT, SYSTEM AND METHOD OF FORMING THE SAME

(71) Applicant: TAIWAN SEMICONDUCTOR MANUFACTURING COMPANY, LTD., Hsinchu (TW)

(72) Inventors: Yen Lin CHUNG Chung, Hsinchu (TW); Kao-Cheng Lin, Hsinchu (TW); Wei Min Chan, Hsinchu (TW); Yen-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 400 days.

(21) Appl. No.: 18/498,350

(22) Filed: Oct. 31, 2023

(65) Prior Publication Data

US 2024/0276696 A1     Aug. 15, 2024

Related U.S. Application Data

(60) Provisional application No. 63/485,097, filed on Feb. 15, 2023.

(51) Int. Cl.
*H10B 10/00*      (2023.01)
*G06F 30/392*      (2020.01)

(52) U.S. Cl.
CPC ......... *H10B 10/125* (2023.02); *G06F 30/392* (2020.01)

(58) Field of Classification Search
CPC ...... H10B 10/125; H10B 10/12; G06F 30/392
See application file for complete search history.

(56) References Cited

U.S. PATENT DOCUMENTS

| | | | | |
|---|---|---|---|---|
| 11,737,254 B2 * | 8/2023 | Chiu | .................. | G11C 11/412 |
| 2013/0170275 A1 | 7/2013 | Kumar et al. | | |
| 2019/0198508 A1 | 6/2019 | Sharma et al. | | |
| 2024/0251541 A1 * | 7/2024 | Chung | ................ | G11C 11/419 |
| 2025/0056782 A1 * | 2/2025 | Chou | ............... | H10D 84/0172 |

FOREIGN PATENT DOCUMENTS

| | | |
|---|---|---|
| TW | 200807416 | 2/2008 |
| TW | 202217813 | 5/2022 |

* cited by examiner

*Primary Examiner* — Allison Bernstein
(74) *Attorney, Agent, or Firm* — Hauptman Ham, LLP

(57) ABSTRACT

A dual-port memory cell includes a first, second, third, and fourth pass-gate transistor, and a first and a second word line. The first pass-gate transistor includes a first gate on a first level. The second pass-gate transistor includes a second gate on a second level below the first level. The third pass-gate transistor includes a third gate on the first level. The fourth pass-gate transistor includes a fourth gate on the second level. The first word line is on a first metal layer above a front-side of a substrate, and is coupled to the first and third pass-gate transistors that correspond to a first port of the dual-port memory cell. The second word line is on a second metal layer below a back-side of the substrate, and is coupled to the second and fourth pass-gate transistors that correspond to a second port of the dual-port memory cell.

20 Claims, 19 Drawing Sheets

800

802 — Generate a layout design of an integrated circuit

804 — Manufacture the integrated circuit based on the layout design

INTEGRATED CIRCUIT, SYSTEM AND METHOD OF FORMING THE SAME

PRIORITY CLAIM

This application claims the benefit of U.S. Provisional Application No. 63/485,097, filed Feb. 15, 2023, which is incorporated herein by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices is also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
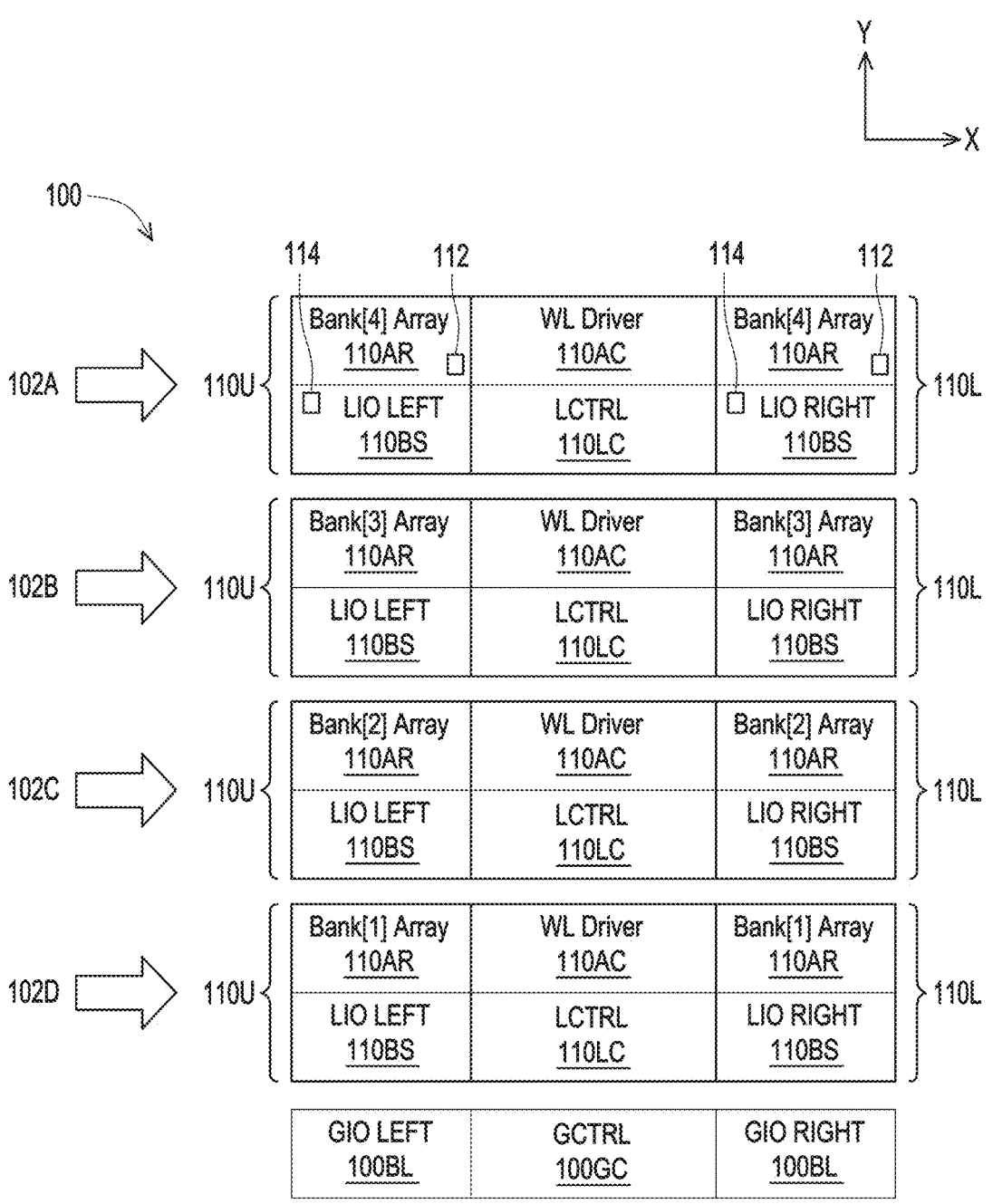
FIG. 1 is a block diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a dual-port memory cell includes a first pass-gate transistor of a first type. In some embodiments, the first pass-gate transistor includes a first gate on a first level.

In some embodiments, the dual-port memory cell further includes a second pass-gate transistor. In some embodiments, the second pass-gate transistor is of a second type different from the first type. In some embodiments, the second pass-gate transistor includes a second gate on a second level. In some embodiments, the second level is below the first level.

In some embodiments, the dual-port memory cell further includes a third pass-gate transistor of the first type. In some embodiments, the third pass-gate transistor includes a third gate on the first level.

In some embodiments, the dual-port memory cell further includes a fourth pass-gate transistor of the second type. In some embodiments, the fourth pass-gate transistor includes a fourth gate on the second level.

In some embodiments, the first pass-gate transistor and the third pass-gate transistor correspond to a first port of the dual-port memory cell. In some embodiments, the second pass-gate transistor and the fourth pass-gate transistor correspond to a second port of the dual-port memory cell.

In some embodiments, the dual-port memory cell further includes a first word line. In some embodiments, the first word line extends in a first direction, and is on a first metal layer. In some embodiments, the first metal layer is above a front-side of a substrate. In some embodiments, the first word line is coupled to the first pass-gate transistor and the third pass-gate transistor.

In some embodiments, the dual-port memory cell further includes a second word line. In some embodiments, the second word line extends in the first direction, and is on a second metal layer. In some embodiments, the second metal layer is below a back-side of the substrate opposite from the front-side of the substrate. In some embodiments, the back-side of the substrate is opposite from the front-side of the substrate. In some embodiments, the second word line is coupled to the second pass-gate transistor and the fourth pass-gate transistor.

In some embodiments, the dual-port memory cell further includes a first gate isolation layer between the first gate and the second gate. In some embodiments, the first gate isolation layer electrically insulates the first gate and the second gate from each other.

In some embodiments, the dual-port memory cell further includes a second gate isolation layer between the third gate and the fourth gate. In some embodiments, the second gate isolation layer electrically insulates the third gate and the fourth gate from each other.

In some embodiments, by electrically insulating the first gate and the second gate from each other, and electrically insulating the third gate and the fourth gate from each other, the memory cell can be used as a dual-port memory cell with the first port and the second port that occupies less area than other approaches.

FIG. 1 is a block diagram of a memory circuit 100, in accordance with some embodiments.

FIG. 1 is simplified for the purpose of illustration. In some embodiments, memory circuit 100 includes various elements in addition to those depicted in FIG. 1 or is otherwise arranged to perform the operations discussed below.

Memory circuit 100 is an IC that includes memory partitions 102A-102D, a global control circuit 100GC and global input output (GIO) circuits 100BL.

Each memory partition 102A-102D includes memory banks 110U and 110L adjacent to a word line (WL) driver circuit 110AC and a local control circuit 110LC. Each memory bank 110U and 110L includes a memory cell array 110AR and a local input output (LIO) circuit 110BS.

A memory partition, e.g., a memory partition 102A-102D, is a portion of memory circuit 100 that includes a subset of memory devices (not shown in FIG. 1) and adjacent circuits configured to selectively access the subset of memory devices in program and read operations. In the FIG. 1 embodiment, memory circuit 100 includes a total of four partitions. In some embodiments, memory circuit 100 includes a total number of partitions greater or fewer than four.

GIO circuit 100BL is configured to control access to one or more electrical paths, e.g., bit lines, to each memory device of the corresponding memory bank 110U or 110L of each memory partition 102A-102D, e.g., by generating one or more bit line signals. In some embodiments, GIO circuit 100BL includes a global bit line driver circuit. In some embodiments, GIO circuit 100BL is coupled to each memory bank 110U and 110L by a corresponding global bit line (not shown).

Global control circuit 100GC is configured to control some or all of program and read operations on each memory partition 102A-102D, e.g., by generating and/or outputting one or more control and/or enable signals.

In some embodiments, global control circuit 100GC includes one or more analog circuits configured to interface with memory partitions 102A-102D, cause data to be programmed in one or more memory devices, and/or use data received from one or more memory devices in one or more circuit operations. In some embodiments, global control circuit 100GC includes one or more global address decoder or pre-decoder circuits configured to output one or more address signals to the WL driver circuit 110AC of each memory partition 102A-102D.

Each WL driver circuit 110AC is configured to generate word line signals on corresponding word lines WL. In some embodiments, each WL driver circuit 110AC is configured to output word line signals on corresponding word lines WL to the adjacent memory banks 110U and 110L of the corresponding memory partition 102A-102D.

Each local control circuit 110LC is an electronic circuit configured to receive one or more address signals. Each local control circuit 110LC is configured to generate signals corresponding to adjacent subsets of memory devices identified by the one or more address signals. In some embodiments, the adjacent subsets of memory devices correspond to columns of memory devices. In some embodiments, each local control circuit 110LC is configured to generate each signal as a complementary pair of signals. In some embodiments, each local control circuit 110LC is configured to output the signals to corresponding word line driver circuits within the adjacent WL driver circuit 110AC of the corresponding memory partition 102A-102D. In some embodiments, the local control circuit 110LC includes a bank decoder circuit.

Each LIO circuit 110BS is configured to selectively access one or more bit lines (shown in FIGS. 2A-2B) coupled to adjacent subsets of memory devices of the corresponding memory cell array 110AR responsive to GIO circuit 100BL, e.g., based on one or more BL control signals. In some embodiments, the adjacent subsets of memory devices correspond to rows of memory devices. In some embodiments, the LIO circuit 110BS includes a bit line selection circuit.

Each LIO circuit 110BS includes one or more circuits 114. For case of illustration, circuit 114 is not shown in memory bank 110U and 110L of memory partitions 102B, 102C and 102D. In some embodiments, each circuit 114 includes at least a sense amplifier circuit. In some embodiments, during a read operation, the sense amplifier circuit is configured to read data from at least one memory cell 112 in a corresponding column of memory cells in the corresponding memory cell array 110AR, in accordance with some embodiments. In some embodiments, each circuit 114 in LIO circuit 110BS is coupled to a corresponding column of memory devices 112 in memory cell array 110AR.

Each memory bank 110U and 110L includes the corresponding memory cell array 110AR including memory cells or memory devices 112 configured to be accessed in program and read operations by the adjacent LIO circuit 110BS and the adjacent WL driver circuit 110AC.

Each memory cell array 110AR includes an array of memory devices 112 having N rows and M columns, where M and N are positive integers. The rows of cells in memory cell array 102 are arranged in a first direction X. The columns of cells in memory cell array 102 are arranged in a second direction Y. The second direction Y is different from the first direction X. In some embodiments, the second direction Y is perpendicular to the first direction X. In some embodiments, each memory cell array 110AR is divided into an upper region and a lower region (not shown). In some embodiments, each column of memory devices 112 in memory cell array 110AR is coupled to a corresponding circuit 114 in LIO circuit 110BS.

Memory device 112 is shown in memory bank 110U and 110L of memory partition 102A. For case of illustration, memory device 112 is not shown in memory bank 110U and 110L of memory partitions 102B, 102C and 102D.

Memory device 112 is an electrical, electromechanical, electromagnetic, or other device configured to store bit data represented by logical states. At least one logical state of memory device 112 is capable of being programmed in a write operation and detected in a read operation. In some embodiments, a logical state corresponds to a voltage level of an electrical charge stored in a given memory device 112. In some embodiments, a logical state corresponds to a physical property, e.g., a voltage, a current, a resistance or a magnetic orientation, of a component of a given memory device 112.

In some embodiments, memory device 112 includes one or more dual port (DP) static random access memory (SRAM) cells. In some embodiments, memory device 112 includes one or more single port (SP) SRAM cells. In some embodiments, memory device 112 includes one or more multi-port SRAM cells. Different types of memory cells in memory device 112 are within the contemplated scope of the present disclosure. In some embodiments, memory device 112 includes one or more dynamic random access memory (DRAM) cells. In some embodiments, memory device 112 includes one or more one-time programmable (OTP) memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, memory device 112 is an OTP memory device including one or more OTP memory cells.

Other configurations of memory circuit 100 are within the scope of the present disclosure.

Figure 2A:
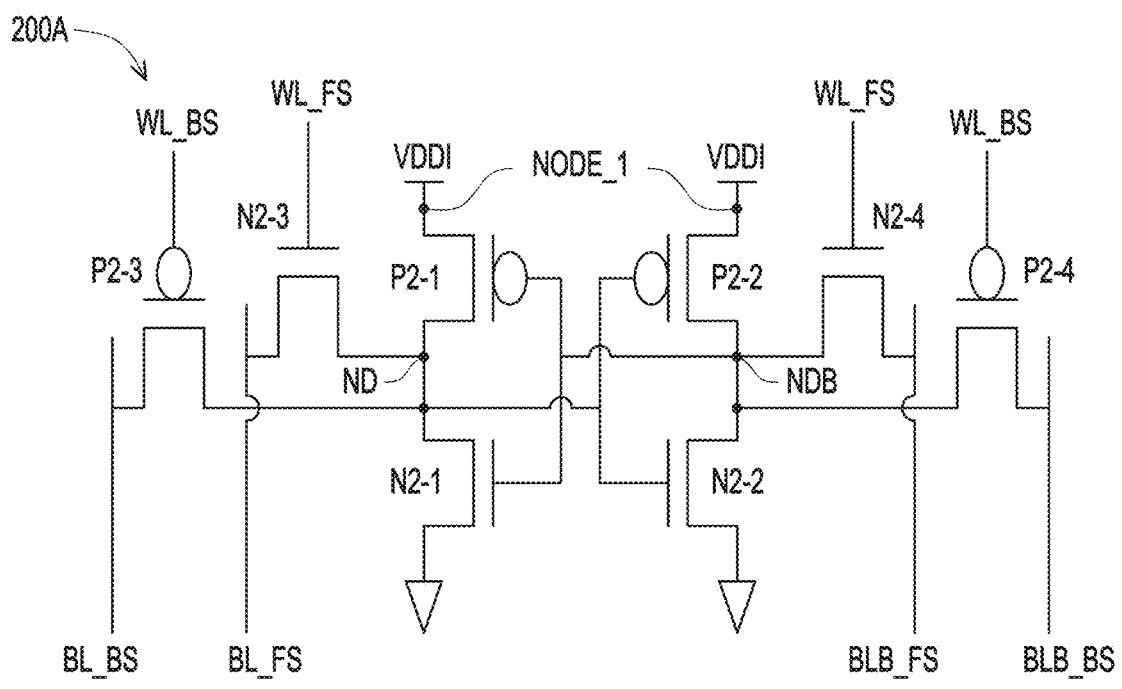
FIGS. 2A-2B are corresponding circuit diagrams of corresponding memory cells usable in FIG. 1, in accordance with some embodiments.
Figure 2B:
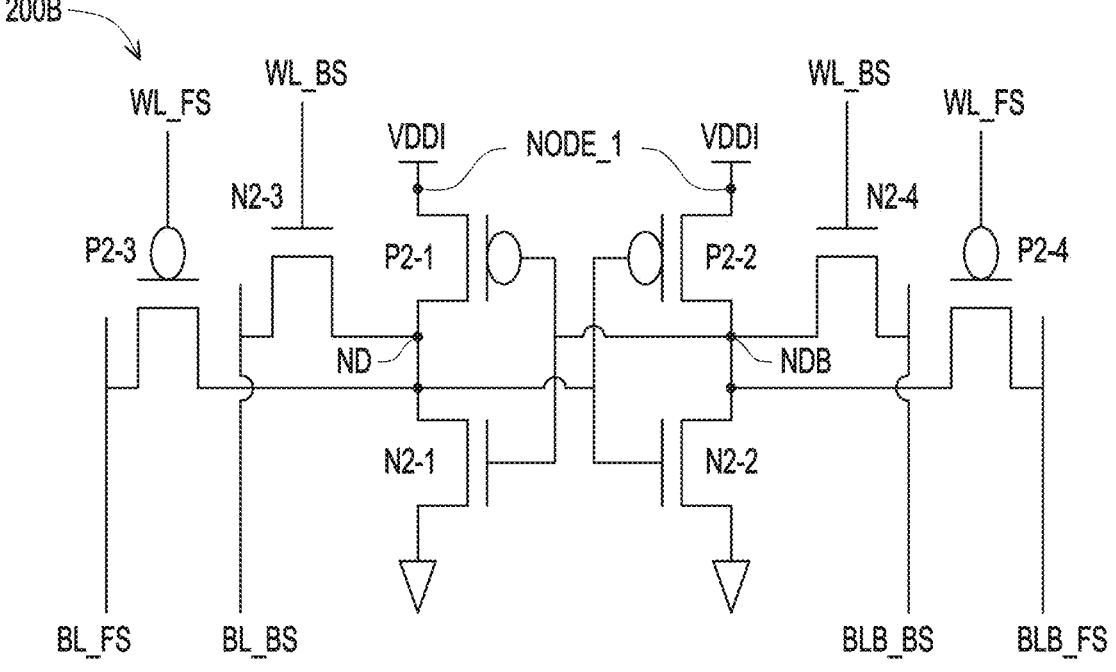

FIGS. 2A-2B are corresponding circuit diagrams of corresponding memory cells 200A and 200B usable in FIG. 1, in accordance with some embodiments.

FIG. 2A is a circuit diagram of a memory cell 200A usable in FIG. 1, in accordance with some embodiments.

At least one of memory cell 200A or 200B is usable as one or more memory cells MCB in at least one of memory cell array 110AR of FIG. 1 or memory device 112 of FIG. 1.

At least one of memory cell 200A or 200B is an eight transistor (8T) dual port (DP) SRAM memory cell. In some embodiments, at least one of memory cell 200A or 200B employs a number of transistors other than eight. Other types of memory are within the scope of various embodiments. In some embodiments, a dual port memory cell is a type of RAM that is configured to support multiple reads or writes occurring at the same time at different addresses within a memory cell array (e.g., memory cell array 110AR in FIG. 1). In some embodiments, a dual-port memory cell is configured to support two memory cell accesses (e.g., reads or writes) per clock cycle.

Memory cell 200A comprises P field effect transistors (PFET) P2-1, P2-2, P2-3 and P2-4, and NFET transistors N2-1, N2-2, N2-3, and N2-4. PFET transistors P2-1 and P2-2 and NFET transistors N2-1 and N2-2 form a cross latch or a pair of cross-coupled inverters. For example, PFET transistor P2-1 and NFET transistor N2-1 form a first inverter while PFET transistor P2-2 and NFET transistor N2-2 form a second inverter.

A source terminal of each of PFET transistors P2-1 and P2-2 is configured as a voltage supply node NODE_1. Each voltage supply node NODE_1 is coupled to a first voltage supply VDDI.

Each of a drain terminal of PFET transistor P2-1, a drain terminal of NFET transistor N2-1, a gate terminal of PFET transistor P2-2, a gate terminal of NFET transistor N2-2, a source terminal of NFET transistor N2-3 and a source terminal of PFET transistor P2-3 are coupled together, and are configured as a storage node ND.

Each of a drain terminal of PFET transistor P2-2, a drain terminal of NFET transistor N2-2, a gate terminal of PFET transistor P2-1, a gate terminal of NFET transistor N2-1, a source terminal of NFET transistor N2-4 and a source terminal of PFET transistor P2-4 are coupled together, and are configured as a storage node NDB.

A source terminal of each of NFET transistors N2-1 and N2-2 is configured as a supply reference voltage node (not labelled) having a supply reference voltage VSS. The source terminal of each of NFET transistors N2-1 and N2-2 is also coupled to reference voltage supply VSS.

A word line WL_FS is coupled with a gate terminal of each of NFET transistors N2-3 and N2-4. Word line WL_FS is also called a write control line because NFET transistors N2-3 and N2-4 are configured to be controlled by a signal on word line WL_FS in order to transfer data between bit lines BL_FS, BL_BS and corresponding nodes ND, NDB.

A word line WL_BS is coupled with a gate terminal of each of PFET transistors P2-3 and P2-4. Word line WL_BS is also called a write control line because PFET transistors P2-3 and P2-4 are configured to be controlled by a signal on word line WL_BS in order to transfer data between bit lines BL_FS, BL_BS and corresponding nodes ND, NDB.

In some embodiments, the signal of the word line WL_BS is equal to a voltage supply VDD. In some embodiments, when the signal of the word line WL_BS is equal to the voltage supply VDD, the PFET transistors P2-3 and P2-4 are turned off.

A drain terminal of NFET transistor N2-3 is coupled to a bit line BL_FS. A drain terminal of NFET transistor N2-4 is coupled to a bit line bar BLB_FS. A drain terminal of PFET transistor P2-3 is coupled to the bit line BL_BS. A drain terminal of PFET transistor P2-4 is coupled to the bit line bar BLB_BS.

Bit lines BL_FS and BL_BS and bit line bars BLB_FS or BLB_BS are configured as both data input and output for memory cell 200A-200B. In some embodiments, in a write operation, applying a logical value to bit line BL_FS and the opposite logical value to bit line bar BLB_FS enables writing the logical values on the bit lines to memory cell 200A-200B. In some embodiments, in a write operation, applying a logical value to bit line BL_BS and the opposite logical value to bit line bar BLB_BS enables writing the logical values on the bit lines to memory cell 200A-200B.

Each of bit lines BL_FS or BL_BS and bit line bar BLB_FS or BLB_BS is called a data line because the data carried on bit lines BL_FS or BL_BS and bit line bar BLB_FS or BLB_BS are written to and read from corresponding nodes ND and NDB.

In some embodiments, memory cell 200A is a dual port memory cell, where word line WL_FS is a first word line (e.g., WL1), word line WL_BS is a second word line (e.g., WL2), bit line BL_FS is a first bit line (e.g., BL1), bit line WL_BS is a second bit line (e.g., BL2), bit line bar BLB_FS is a first bit line (e.g., BLB1) and bit line bar BLB_BS is a second bit line bar (e.g., BLB2).

Other configurations of memory cell 200A are within the scope of the present disclosure.

FIG. 2B is a circuit diagram of a memory cell 200B usable in FIG. 1, in accordance with some embodiments.

Memory cell 200B is a variation of memory cell 200A of FIG. 2A, and similar detailed description is therefore omitted. In comparison with memory cell 200A of FIG. 2A, the word lines WL_FS and WL_BS in FIG. 2B are flipped with the corresponding word lines WL_BS and WL_FS in FIG. 2A, and similar detailed description is therefore omitted.

In comparison with memory cell 200A of FIG. 2A, the bit lines BL_FS and BL_BS in FIG. 2B are flipped with the corresponding bit lines BL_BS and BL_FS in FIG. 2A, and similar detailed description is therefore omitted.

In comparison with memory cell 200A of FIG. 2A, the bit line bars BLB_FS and BLB_BS in FIG. 2B are flipped with the corresponding bit line bars BLB_BS and BLB_FS in FIG. 2A, and similar detailed description is therefore omitted.

In FIG. 2B, word line WL_BS is coupled with a gate terminal of each of NFET transistors N2-3 and N2-4.

In FIG. 2B, word line WL_FS is coupled with a gate terminal of each of PFET transistors P2-3 and P2-4.

In FIG. 2B, the drain terminal of NFET transistor N2-3 is coupled to a bit line BL_BS, and the drain terminal of NFET transistor N2-4 is coupled to a bit line bar BLB_BS.

In FIG. 2B, the drain terminal of PFET transistor P2-3 is coupled to the bit line BL_FS, and the drain terminal of PFET transistor P2-4 is coupled to the bit line bar BLB_FS.

In some embodiments, memory cell 200B is a dual port memory cell, where word line WL_BS is a first word line (e.g., WL1), word line WL_FS is a second word line (e.g., WL2), bit line BL_BS is a first bit line (e.g., BL1), bit line WL_FS is a second bit line (e.g., BL2), bit line bar BLB_BS is a first bit line (e.g., BLB1) and bit line bar BLB_FS is a second bit line bar (e.g., BLB2).

Other configurations of memory cell 200B are within the scope of the present disclosure.

FIGS. 3A-3D are corresponding diagrams of corresponding portions 300A-300D of a layout design 300 of a corresponding integrated circuit, in accordance with some embodiments.

Layout design 300 is a layout of an integrated circuit 400 of FIG. 4A-4I or memory cell 200A. Layout design 300 is a layout of memory cell 200A of FIG. 2A.

Portion 300A includes one or more features of layout design 300 of an active level or an oxide diffusion (OD) level, a gate (POLY) level, a metal over diffusion (MD) level, a backside metal over diffusion (BMD) level, a metal over diffusion local interconnect (MDLI) level, a butted contact (BCT) level, a metal 0 (M0) level, a backside metal 0 (BM0) level, a via over gate (VG) level, a backside via over gate (BVG) level, a via over diffusion (VD) level, and a backside via over diffusion (BVD) level.

Portion 300B includes one or more features of layout design 300 of the OD level, the POLY level, the MD level, the MDLI level, the BCT level, the M0 level, the VG level, the VD level, the BMD level, the BM0 level, the BVG level, and the BVD level.

Portion 300C includes one or more features of layout design 300 of the OD level, the POLY level, the MD level, the MDLI level, the BCT level, the M0 level, the VG level and the VD level.

Portion 300D include one or more features of layout design 300 of the OD level, the POLY level, the BMD level, the MDLI level, the BCT level, the BM0 level, the BVG level, and the BVD level.

FIGS. 3A-3D are corresponding diagrams of corresponding portions 300A-300D of layout design 300, simplified for case of illustration.

For case of illustration, some of the labeled elements of one or more of FIGS. 1-6 are not labelled in one or more of FIGS. 1-6. In some embodiments, layout design 300 includes additional elements not shown in FIGS. 3A-3D.

Layout design 300 includes one or more features of the OD level, the POLY level, the MD level, the M0 level, the VG level, the VD level, the M1 level, the V0 level, the BMD level, the BM0 level, the BVG level and the BVD level. In some embodiments, at least layout design 300 or 500, or integrated circuit 400 or 600 includes additional elements not shown in FIG. 3A-3D, 4A-4I, 5 or 6.

Layout design 300 is usable to manufacture integrated circuit 400 of FIGS. 4A-4I.

Figure 4A:
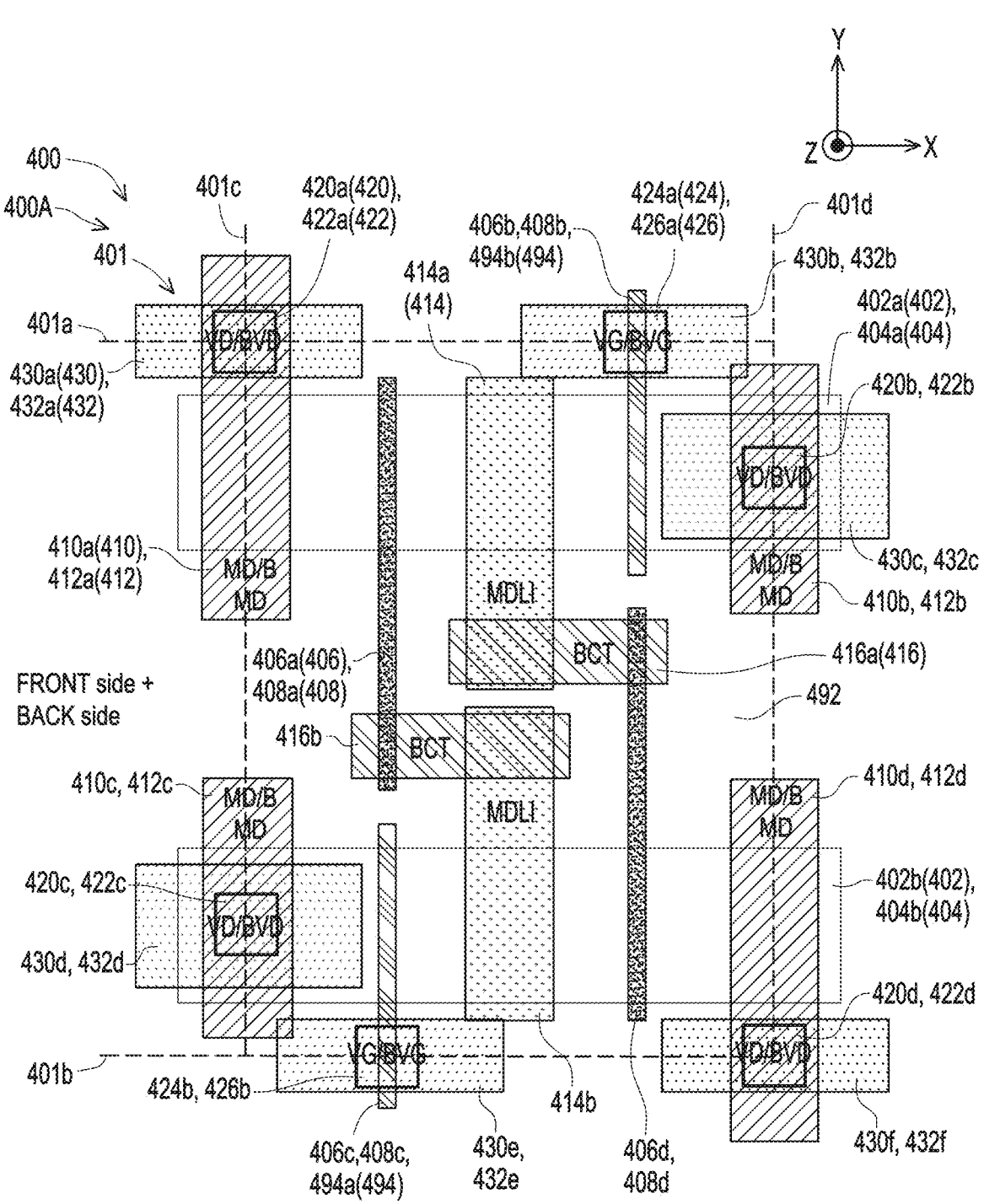
FIGS. 4A-4I are diagrams of an integrated circuit, in accordance with some embodiments.
Figure 4B:
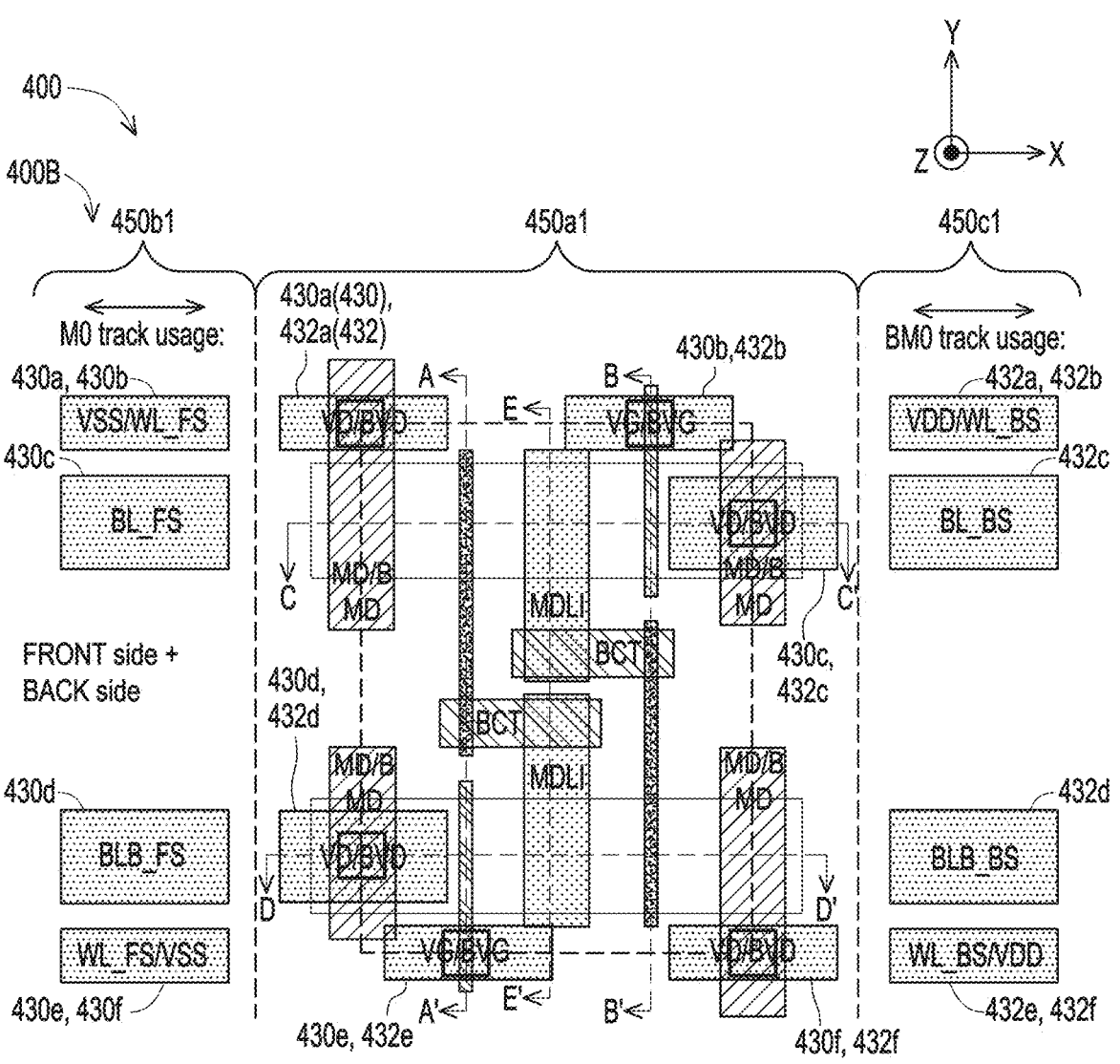
Figure 4C:
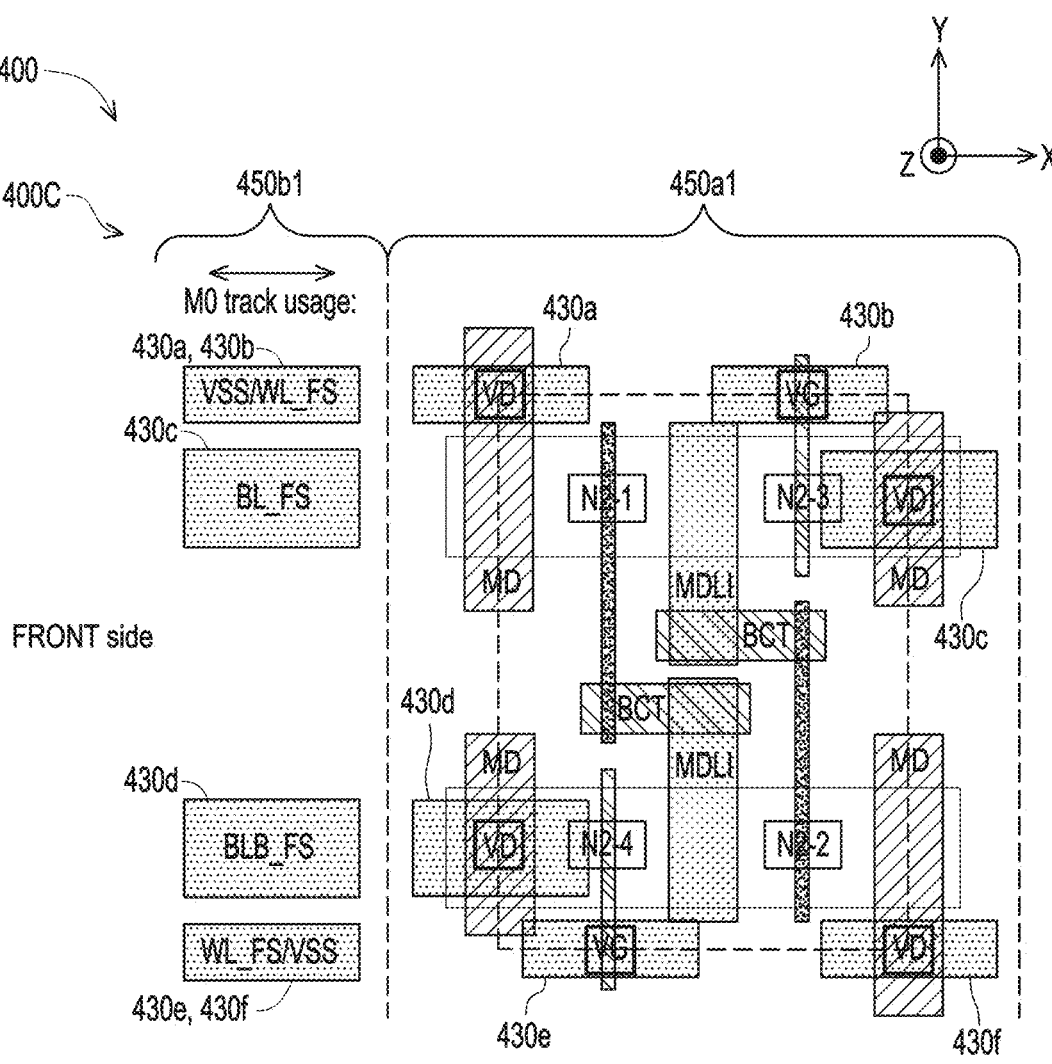
Figure 4D:
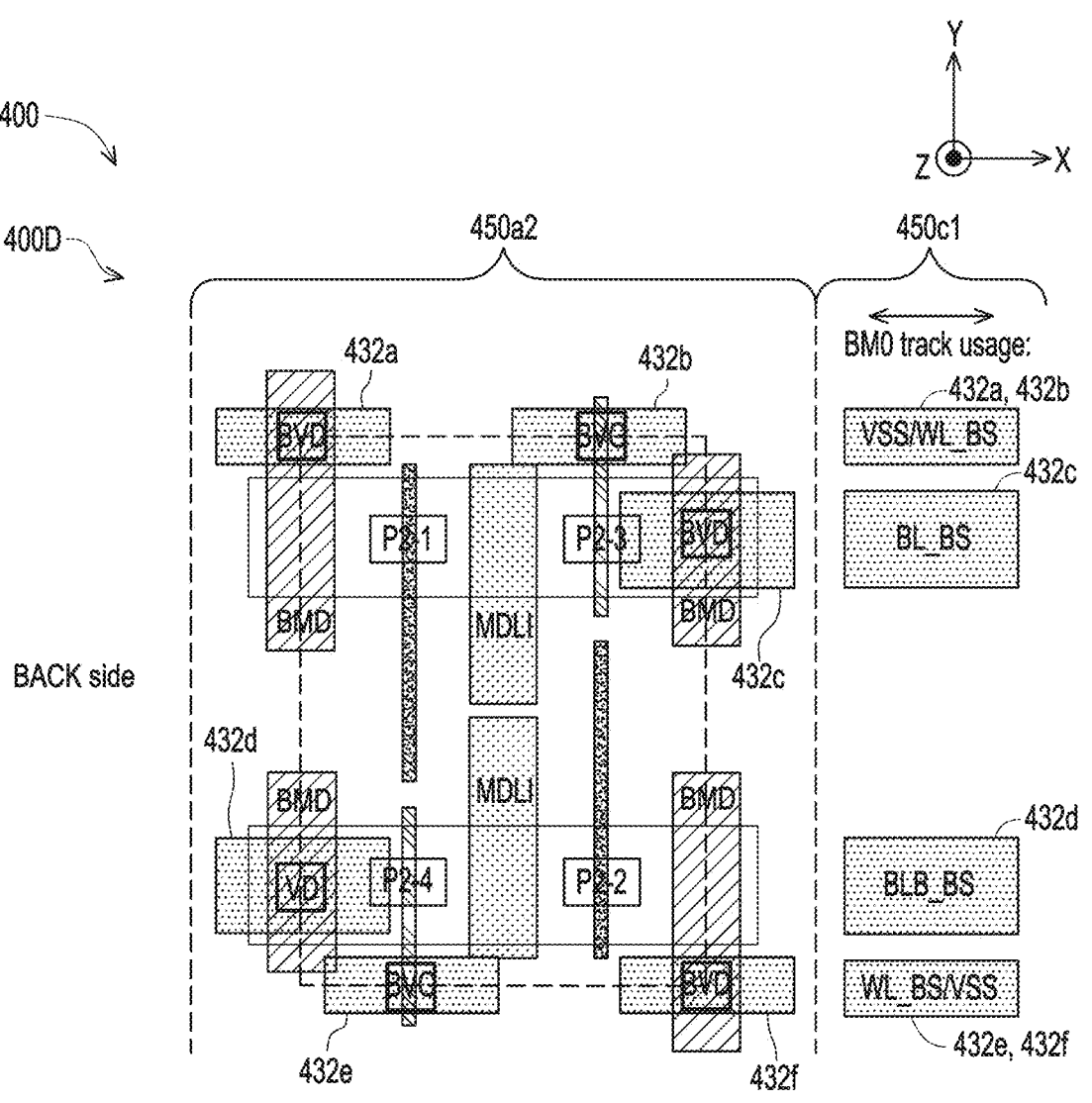

Portion 300A is a layout of portion 400A of integrated circuit 400 of FIG. 4A, portion 300B is a layout of portion 400B of integrated circuit 400 of FIG. 4B, portion 300C is a layout of portion 400C of integrated circuit 400 of FIG. 4C, and portion 300D is a layout of portion 400D of integrated circuit 400 of FIG. 4D, and similar detailed description is omitted for brevity.

Layout design 300 includes a cell 301. The cell 301 has cell boundaries 301a and 301b that extend in a first direction X, and cell boundaries 301c and 301d that extend in a second direction Y. In some embodiments, at least one of the first direction X, the second direction Y or a third direction Z is different from another of the first direction X, the second direction Y or the third direction Z. In some embodiments, layout design 300 abuts other cell layout designs (not shown) along cell boundaries 301c and 301d. In some embodiments, layout design 300 abuts other cell layout designs (not shown) along cell boundaries 301a and 301b that extend in the first direction X. In some embodiments, layout design 300 is a single height standard cell. In some embodiments, cell 301 is useable to manufacture a cell 401.

In some embodiments, cell 301 is a standard cell, and layout design 300 corresponds to a layout of a standard cell defined by cell boundaries 301a, 301b, 301c and 301d. In some embodiments, a cell 301 is a predefined portion of layout design 300 including one or more transistors and electrical connections configured to perform one or more circuit functions. In some embodiments, cell 301 is bounded by cell boundaries 301a, 301b, 301c and 301d, and thus corresponds to a region of functional circuit components or devices that are part of a standard cell. In some embodiments, layout design 300 is a layout design of a memory cell, such as memory cell 200A of FIG. 2A or 200B of FIG. 2B.

Layout design 300 includes one or more active region layout patterns 302a or 302b (collectively referred to as a "set of active region patterns 302") or one or more active region layout patterns 304a or 304b (collectively referred to as a "set of active region patterns 304") extending in the first direction X.

Embodiments of the present disclosure use the term "layout pattern" which is hereinafter also referred to as "patterns" in the remainder of the present disclosure for brevity.

The set of active region patterns 302 is above the set of active region patterns 304.

Active region patterns 302a and 302b of the set of active region patterns 302 are separated from one another in the second direction Y. Active region patterns 304a and 304b of the set of active region patterns 304 are separated from one another in the second direction Y.

Active region patterns 302a and 304a are separated from one another in a third direction Z. Active region patterns 302b and 304b are separated from one another in the third direction Z.

The set of active region patterns 302 is usable to manufacture a corresponding set of active regions 402 of integrated circuit 100, 200A, 200B, 400 or 600. The set of active region patterns 304 is usable to manufacture a corresponding set of active regions 404 of integrated circuit 100, 200A, 200B, 400 or 600.

In some embodiments, at least one of the set of active regions 402 or 404 are located on the front-side 403a of integrated circuit 100, 200A, 200B, 400 or 600. In some embodiments, at least one of the set of active regions 402 or 404 corresponds to source and drain regions of one or more complementary FET (CFET) transistors. In some embodiments, at least one of the set of active regions 402 or 404 correspond to source and drain regions of one or more nanosheet transistors or nanowire transistors. Other transistor types are within the scope of the present disclosure. In some embodiments, at least one of the set of active regions 402 or 404 corresponds to source and drain regions of one or more finFET transistors.

In some embodiments, active region patterns 302a, 302b are usable to manufacture corresponding active regions 402a, 402b of the set of active regions 402 of integrated circuit 100, 200A, 200B, 400 or 600. In some embodiments, active region patterns 304a, 304b are usable to manufacture corresponding active regions 404a, 404b of the set of active regions 404 of integrated circuit 100, 200A, 200B, 400 or 600.

In some embodiments, the set of active region patterns 302 and 304 are referred to as an oxide diffusion (OD) region which defines the source or drain diffusion regions of at least integrated circuit 100, 200A, 200B, 400 or 600 or layout design 300 or 500.

In some embodiments, active region patterns 302a and 302b are usable to manufacture source and drain regions of NFET transistors of integrated circuits 100, 200A, 200B, 400 or 600, and active region patterns 304a and 304b are usable to manufacture source and drain regions of PFET transistors of integrated circuits 100, 200A, 200B, 400 or 600.

In some embodiments, active region patterns 302a and 302b are usable to manufacture source and drain regions of PFET transistors of integrated circuits 100, 200A, 200B, 400 or 600, and active region patterns 304a and 304b are usable to manufacture source and drain regions of NFET transistors of integrated circuits 100, 200A, 200B, 400 or 600.

In some embodiments, the set of active region patterns 302 or 304 is located on a first layout level. In some embodiments, the first layout level corresponds to an active level or an OD level of one or more of layout design 300 or 500 or integrated circuits 100, 200A, 200B, 400 or 600. In some embodiments, the OD level is above the BM0 and the BM1 level.

Other configurations, arrangements on other layout levels or quantities of patterns in the set of active region patterns 302 or 304 are within the scope of the present disclosure.

Layout design 300 further includes one or more gate patterns 306a, 306b, 306c or 306d (collectively referred to as a "set of gate patterns 306"), one or more gate patterns 308a, 308b, 308c or 308d (collectively referred to as a "set of gate patterns 308") extending in the second direction Y.

The set of gate patterns 306 is above the set of gate patterns 308.

Gate patterns 306a and 306c are separated from one another in the second direction Y. Gate patterns 308a and 308c are separated from one another in the second direction Y.

Gate patterns 306b and 306d are separated from one another in the second direction Y. Gate patterns 308b and 308d are separated from one another in the second direction Y.

Gate patterns 306a and 306b are separated from one another in the first direction X. Gate patterns 308a and 308b are separated from one another in the first direction X.

Gate patterns 306c and 306d are separated from one another in the first direction X. Gate patterns 308c and 308d are separated from one another in the first direction X.

In some embodiments, gate patterns 306b and 308b are separated from one another in the third direction Z. In some embodiments, gate patterns 306c and 308c are separated from one another in the third direction Z.

The set of gate patterns 306 is usable to manufacture a corresponding set of gates 406 of integrated circuit 100, 200A, 200B, 400 or 600. The set of gate patterns 308 is usable to manufacture a corresponding set of gates 408 of integrated circuit 100, 200A, 200B, 400 or 600.

In some embodiments, gate patterns 306a, 306b, 306c or 306d are usable to manufacture corresponding gates 406a, 406b, 406c or 406d of the set of gates 406 of integrated circuit 100, 200A, 200B, 400 or 600. In some embodiments, gate patterns 308a, 308b, 308c or 308d are usable to manufacture corresponding gates 408a, 408b, 408c or 408d of the set of gates 408 of integrated circuit 100, 200A, 200B, 400 or 600.

In some embodiments, at least one of the set of gates 406 or 408 are located on the front-side 403a of integrated circuit 100, 200A, 200B, 400 or 600.

Figure 3A:
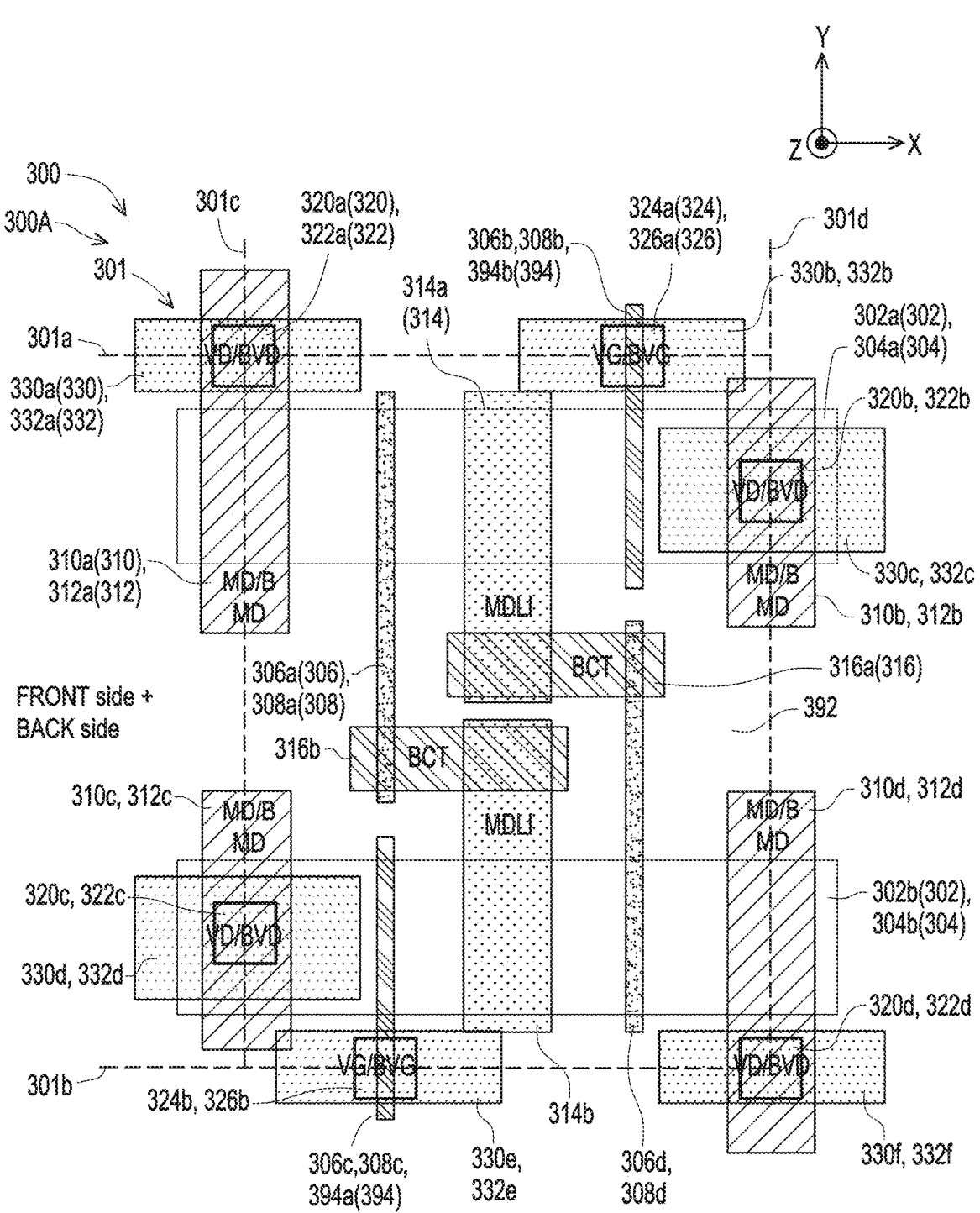
FIGS. 3A-3D are corresponding diagrams of corresponding portions of a layout design of a corresponding integrated circuit, in accordance with some embodiments.
Figure 3B:
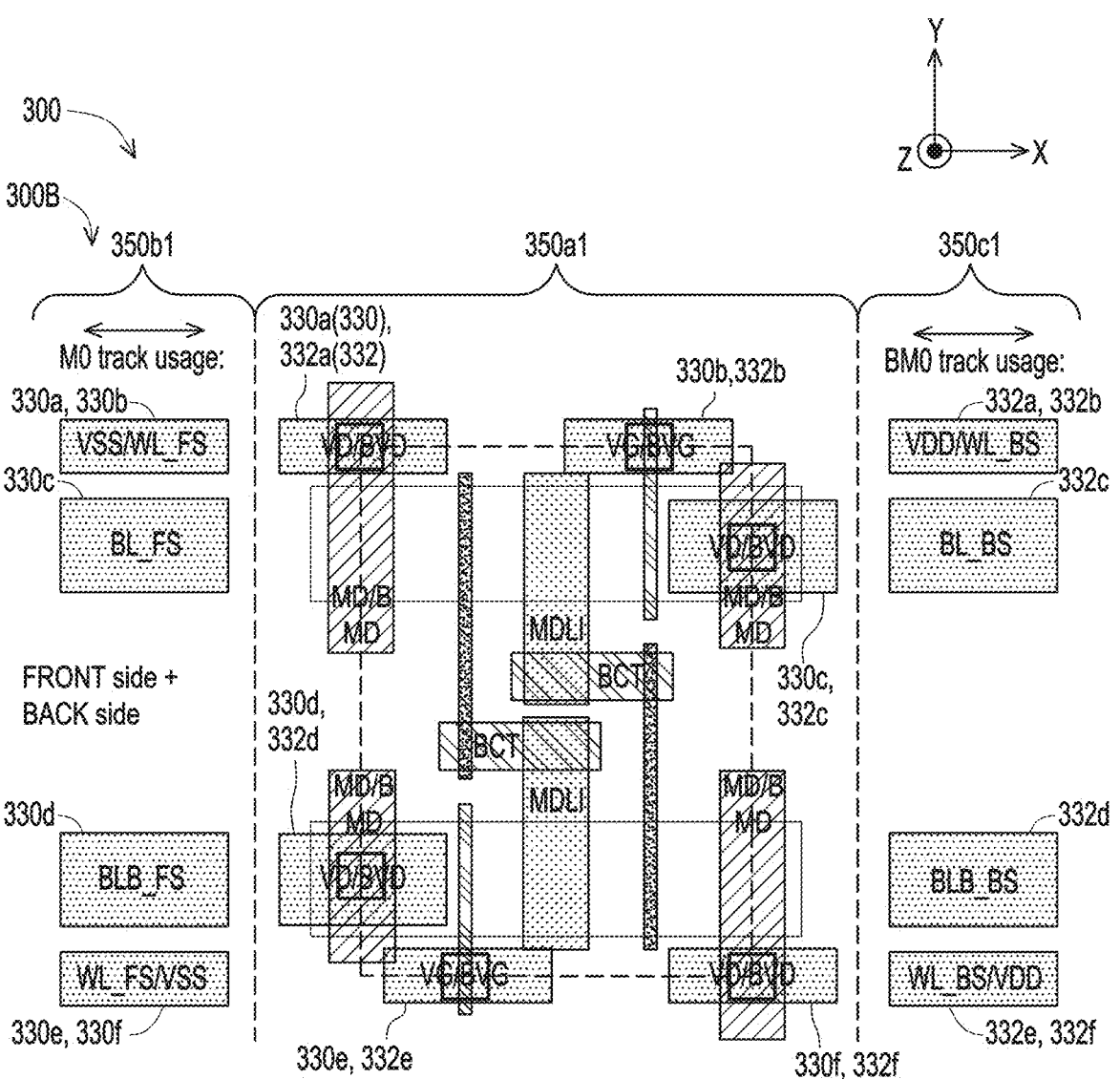
Figure 3C:
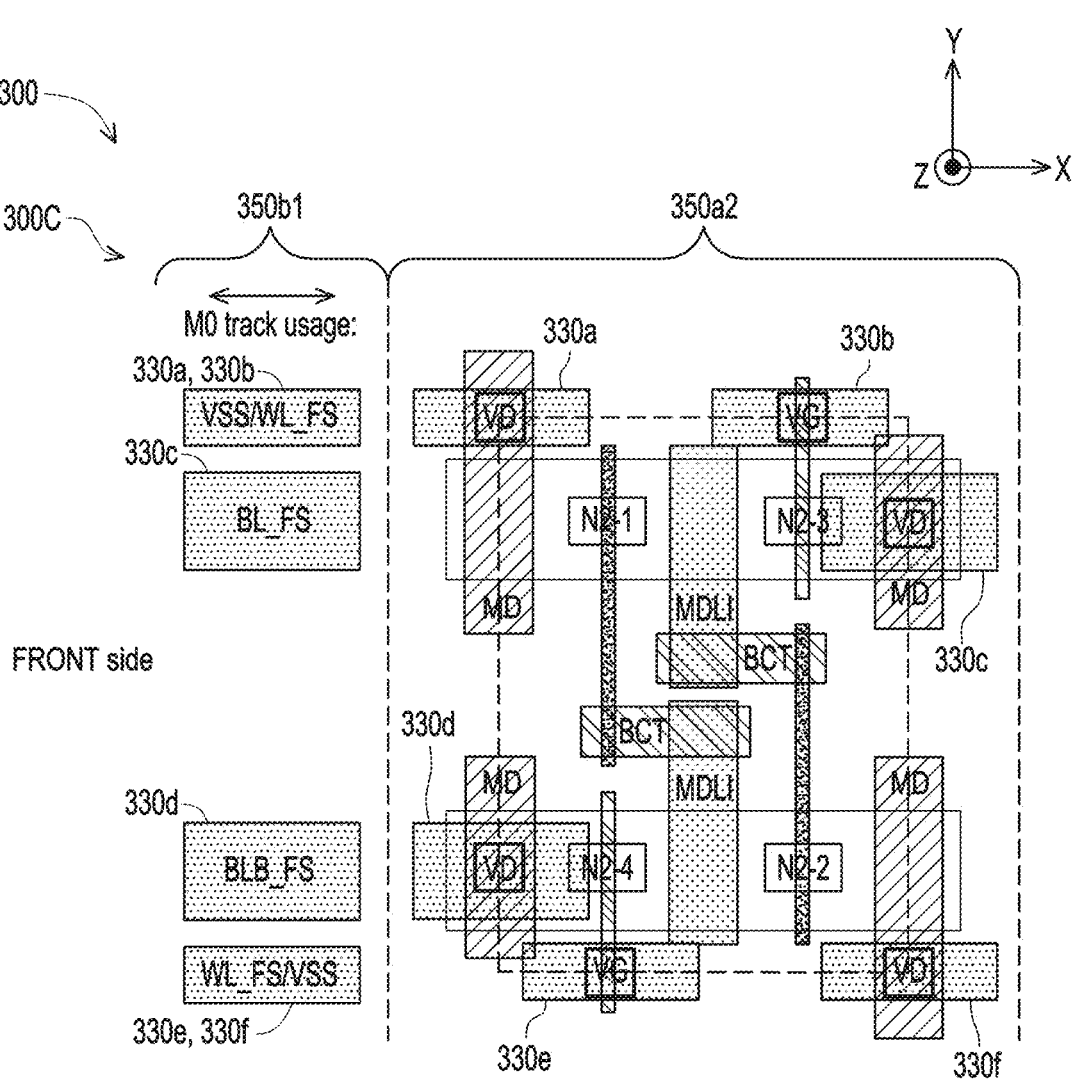
Figure 3D:
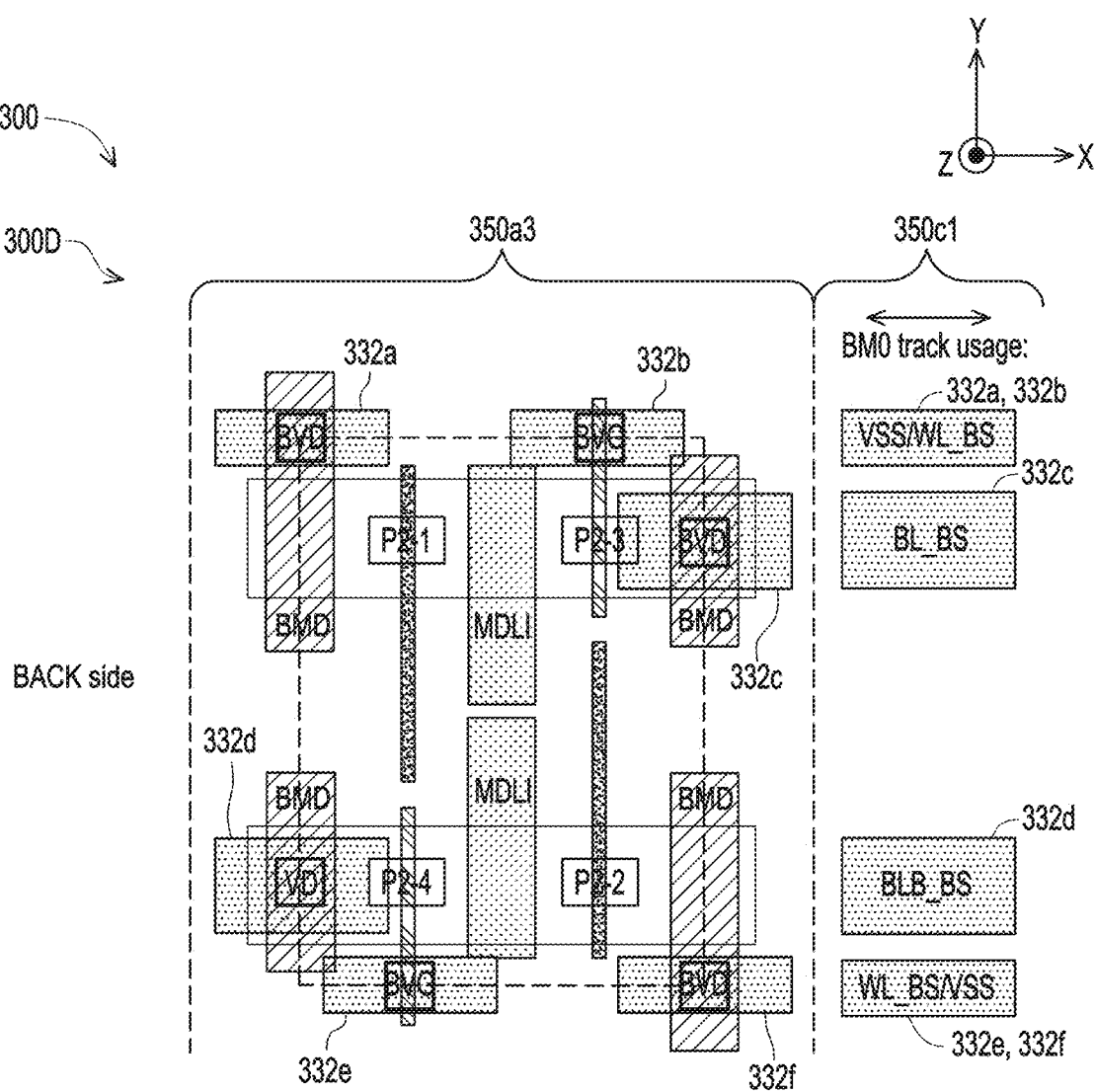

In some embodiments, each of the gate patterns in the set of gate patterns 304 and 306 is shown in FIGS. 3C-3D with labels "N2-1, P2-1, N2-2, P2-2, N2-3, P2-3, N2-4, P2-4" that identify corresponding transistors of FIGS. 2A-2B manufactured by the corresponding gate pattern in FIGS. 3A-3D, and are omitted for brevity.

In some embodiments, the set of gate patterns 306 or 308 encapsulate the set of active region patterns 302 and 304. In some embodiments, a portion of the set of gate patterns 306 or 308 is above the set of active region patterns 302 and 304. In some embodiments, another portion of the set of gate patterns 306 or 308 is below the set of active region patterns 302 and 304.

The set of gate patterns 306 or 308 is positioned on a second layout level. In some embodiments, the second layout level is different from the first layout level. In some embodiments, the second layout level corresponds to the POLY level of one or more of layout design 300 or 500 or integrated circuits 100, 200A, 200B, 400 or 600. In some embodiments, the POLY level is above the BMD and the BM0 level.

Other configurations, arrangements on other layout levels or quantities of patterns in the set of gate patterns 306 or 308 are within the scope of the present disclosure.

Layout design 300 further includes one or more insulating region patterns 394a or 394b (collectively referred to as a "set of insulating region patterns 394") extending in the second direction Y.

In some embodiments, the set of insulating region patterns 394 is between the set of gate patterns 306 and the set of gate patterns 308. In some embodiments, the set of insulating region patterns 394 is above the set of gate patterns 308. In some embodiments, the set of insulating region patterns 394 is below the set of gate patterns 306.

In some embodiments, gate pattern 306b and gate pattern 308b are separated from each other in the third direction Z by the insulating region pattern 394b of the set of insulating region patterns 394.

In some embodiments, gate pattern 306c and gate pattern 308c are separated from each other in the third direction Z by insulating region pattern 394a of the set of insulating region patterns 394.

The set of insulating region patterns 394 is usable to manufacture a corresponding set of insulating regions 494 of integrated circuit 100, 200A, 200B, 400 or 600. The set of insulating region patterns 394 is usable to manufacture a corresponding set of insulating region patterns 494a, 494b of integrated circuit 100, 200A, 200B, 400 or 600.

Other configurations, arrangements on other layout levels or other numbers of portions in insulating region pattern 394 are within the scope of the present disclosure.

Layout design 300 further includes one or more contact patterns 310a, 310b, 310c, 310d (collectively referred to as a "set of contact patterns 310") extending in the second direction Y.

Each of the contact patterns of the set of contact patterns 310 is separated from an adjacent contact pattern of the set of contact patterns 310 in at least the first direction X or the second direction Y.

The set of contact patterns 310 is usable to manufacture a corresponding set of contacts 410 of integrated circuit 100, 200A, 200B, 400 or 600.

In some embodiments, contact pattern 310a, 310b, 310c, 310d of the set of contact patterns 310 is usable to manufacture corresponding contact 410a, 410b, 410c. 410d of the set of contact patterns 410. In some embodiments, the set of contact patterns 310 is also referred to as a set of metal over diffusion (MD) patterns.

In some embodiments, at least one of contact pattern 310a, 310b, 310c, 310d of the set of contact patterns 310 is usable to manufacture source or drain terminals of one of the NFET or PFET transistors of integrated circuit 100, 200A, 200B, 400 or 600.

In some embodiments, contact pattern 310a is usable to manufacture source terminals of NFET transistor N2-1, contact pattern 310b is usable to manufacture source terminals of NFET transistor N2-3, contact pattern 310c is usable to manufacture source terminals of NFET transistor N2-4, and contact pattern 310d is usable to manufacture source terminals of NFET transistor N2-2.

In some embodiments, the set of contact patterns 310 overlaps the set of active region patterns 302 or 304. The set of contact patterns 310 is located on a third layout level. In some embodiments, the third layout level corresponds to the contact level or an MD level of one or more of layout design 300 or 500 or integrated circuits 100, 200A, 200B, 400 or 600. In some embodiments, the third layout level is different from at least one of the first layout level or the second layout level. Other configurations, arrangements on other layout levels or quantities of patterns in the set of contact patterns 310 are within the scope of the present disclosure.

Layout design 300 further includes one or more contact patterns 312a, 312b, 312c, 312d (collectively referred to as a "set of contact patterns 312") extending in the second direction Y.

Each of the contact patterns of the set of contact patterns 312 is separated from an adjacent contact pattern of the set of contact patterns 312 in at least the first direction X or the second direction Y.

The set of contact patterns 310 and 312 are separated from one another in the third direction Z. In some embodiments, contact patterns 310a and 312a are separated from one another in the third direction Z. In some embodiments, contact patterns 310b and 312b are separated from one another in the third direction Z. In some embodiments, contact patterns 310c and 312c are separated from one another in the third direction Z. In some embodiments, contact patterns 310d and 312d are separated from one another in the third direction Z.

The set of contact patterns 312 is usable to manufacture a corresponding set of contacts 412 of integrated circuit 100, 200A, 200B, 400 or 600.

In some embodiments, contact pattern 312a, 312b, 312c, 312d of the set of contact patterns 312 is usable to manufacture corresponding contact 412a, 412b, 412c, 412d of the set of contacts 412. In some embodiments, the set of contacts 412 are on a back-side 403b of integrated circuit 400. In some embodiments, the back-side 403b of integrated circuit 400 is opposite from the front-side of integrated circuit 400. In some embodiments, the set of contacts patterns 312 is also referred to as a set of back-side MD (BMD) patterns.

In some embodiments, contact pattern 312a is usable to manufacture source terminals of PFET transistor P2-1, contact pattern 312b is usable to manufacture source terminals of PFET transistor P2-3, contact pattern 312c is usable to manufacture source terminals of PFET transistor P2-4, and contact pattern 312d is usable to manufacture source terminals of PFET transistor P2-2.

In some embodiments, the set of contact patterns 312 are overlapped by the set of active region patterns 302 or 304. The set of contact patterns 312 is located on a fourth layout level. In some embodiments, the fourth layout level corresponds to the back-side contact level or a back-side MD (BMD) level of one or more of layout design 300 or 500 or integrated circuits 100, 200A, 200B, 400 or 600. In some embodiments, the fourth layout level is different from at least one of the first layout level, the second layout level or the third layout level.

In some embodiments, the BMD level is above the BM0 level. In some embodiments, the BMD level is below the back-side 403b of integrated circuit 400. In some embodiments, the BMD level is below the OD level, the POLY level, the MD level and the M0 level.

Other configurations, arrangements on other layout levels or quantities of patterns in the set of contact patterns 312 are within the scope of the present disclosure.

Layout design 300 further includes one or more contact patterns 314a. 314b (collectively referred to as a "set of contact patterns 314") extending in the second direction Y.

Each of the contact patterns of the set of contact patterns 314 is separated from an adjacent contact pattern of the set of contact patterns 314 in at least the first direction X or the second direction Y.

In some embodiments, the set of contact patterns 314 is between the set of contact patterns 310 and 312. Contact pattern 314a is between contact patterns 310a and 310b. Contact pattern 314a is between contact patterns 312a and 312b. Contact pattern 314b is between contact patterns 310c and 310d. Contact pattern 314b is between contact patterns 312c and 312d.

In some embodiments, contact pattern 314a includes one or more separate discontinuous patterns. In some embodiments, contact pattern 314b includes one or more separate discontinuous patterns.

Contact patterns 314a and 314b are separated from one another in the second direction Y.

The set of contact patterns 314 is usable to manufacture a corresponding set of contacts 414 of integrated circuit 100, 200A, 200B, 400 or 600.

In some embodiments, contact pattern 314a, 314b of the set of contact patterns 314 is usable to manufacture corresponding contact 414a, 414b of the set of contacts 414. In some embodiments, the set of contacts 414 are on a front-side 403a of integrated circuit 400. In some embodiments, the set of contacts patterns 314 is also referred to as a set of local interconnect (MDLI) patterns.

In some embodiments, at least one of contact pattern 314a, 314b of the set of contact patterns 314 is usable to manufacture interconnect structures usable to connect source or drain terminals of one of the NFET or PFET transistors of integrated circuit 100, 200A, 200B, 400 or 600.

In some embodiments, contact pattern 314*a* is usable to manufacture drain terminals of PFET transistor P2-1, drain terminals of NFET transistor N2-1, drain terminals of PFET transistor P2-3 and drain terminals of NFET transistor N2-3.

In some embodiments, contact pattern 314*b* is usable to manufacture drain terminals of PFET transistor P2-2, drain terminals of NFET transistor N2-2, drain terminals of PFET transistor P2-4 and drain terminals of NFET transistor N2-4.

In some embodiments, at least a first portion of the set of contact patterns 314 are overlapped by one or more of the set of active region patterns 302 or 304. In some embodiments, at least a second portion of the set of contact patterns 314 is between the set of active region patterns 302 or 304. In some embodiments, at least a third portion of the set of contact patterns 314 is coplanar with the set of contact patterns 310 or the set of contact patterns 312.

The set of contact patterns 314 is located on a fifth layout level. In some embodiments, the fifth layout level corresponds to the MDLI level of one or more of layout design 300 or 500 or integrated circuits 100, 200A, 200B, 400 or 600. In some embodiments, the fifth layout level is different from at least one of the first layout level or the second layout level.

In some embodiments, the MDLI level includes the MD level and the BMD level. In some embodiments, the MDLI level is below the M0 level. In some embodiments, the MDLI level is above the BM0 level.

Other configurations, arrangements on other layout levels or quantities of patterns in the set of contact patterns 314 are within the scope of the present disclosure.

Layout design 300 further includes one or more contact patterns 316*a* and 316*b* (collectively referred to as a "set of contact patterns 316") extending in the first direction X.

Each of the contact patterns of the set of contact patterns 316 is separated from an adjacent contact pattern of the set of contact patterns 316 in at least the first direction X or the second direction Y.

Contact patterns 316*a* and 316*b* are separated from one another in the second direction Y.

The set of contact patterns 316 is usable to manufacture a corresponding set of contacts 416 of integrated circuit 100, 200A, 200B, 400 or 600.

In some embodiments, contact pattern 316*a*, 326*b* of the set of contact patterns 316 is usable to manufacture corresponding contact 416*a*, 416*b* of the set of contacts 416. The set of contacts 416 is on the front-side 403*a* of integrated circuit 400. Contact 416*a* or 416*b* is on the front-side 403*a* of integrated circuit 400. In some embodiments, the set of contacts patterns 316 is also referred to as a set of butted contacts (BCT) patterns. In some embodiments, the set of contacts 416 is also referred to as a set of butted contacts (BCT).

In some embodiments, at least one of contact pattern 316*a*, 316*b* of the set of contact patterns 316 is usable to manufacture interconnect structures usable to connect at least a gate terminal of one of the NFET or PFET transistors of integrated circuit 100, 200A, 200B, 400 or 600 to source or drain terminals of another of the NFET or PFET transistors of integrated circuit 100, 200A, 200B, 400 or 600.

In some embodiments, the set of contact patterns 316 overlap one or more of the set of active region patterns 302, the set of active region patterns 304, the set of gate patterns 306 or the set of gate patterns 308.

In some embodiments, contact pattern 316*a* overlaps at least one of gate pattern 306*d*, gate pattern 308*d* or contact pattern 314*a*. In some embodiments, contact pattern 316*b* overlaps at least one of gate pattern 306*a*, gate pattern 308*a* or contact pattern 314*b*.

In some embodiments, the set of contact patterns 316 overlap one or more of the set of active region patterns 302 or 304, the set of gate patterns 306 or 308, the set of contact patterns 310 or 312 or the set of contact patterns 314. The set of contact patterns 316 is located on a sixth layout level. In some embodiments, the sixth layout level corresponds to the BCT level of one or more of layout design 300 or 600 or integrated circuits 100, 200A, 200B, 400 or 600. In some embodiments, the sixth layout level is different from at least one of the first layout level, the second layout level, the third layout level, the fourth layout level or the fifth layout level. In some embodiments, the BCT level is between the M0 level and at least one of the OD level, the POLY level, the MD level or the MDLI level. In some embodiments, the BCT level is above at least one of the OD level, the POLY level, the MD level or the MDLI level. In some embodiments, the MDLI level is below the M0 level.

Other configurations, arrangements on other layout levels or quantities of patterns in the set of contact patterns 316 are within the scope of the present disclosure.

Layout design 300 further includes one or more conductive feature patterns 330*a*, 330*b*, 330*c*, 330*d*, 330*e*, 330*f* (collectively referred to as a "set of conductive feature patterns 330") extending in the first direction X.

Each conductive feature pattern in the set of conductive feature patterns 330 is separated from another conductive feature pattern in the set of conductive feature patterns 330 in the second direction Y.

The set of conductive feature patterns 330 overlap at least one of the set of active region patterns 302 or 304, the set of gate patterns 306 or 308 or the set of contact patterns 310, 312, 314 or 316.

The set of conductive feature patterns 330 is usable to manufacture a corresponding set of conductors 430 of integrated circuit 100, 200A, 200B, 400 or 600. Conductive feature patterns 330*a*, 330*b*, 330*c*, 330*d*, 330*e*, 330*f* are usable to manufacture corresponding conductors 430*a*, 430*b*, 430*c*, 430*d*, 430*c*, 430*f* of integrated circuit 100, 200A, 200B, 400 or 600. In some embodiments, at least one conductor of the set of conductors 430 is located on the front-side 403*a* of integrated circuit 100, 200A, 200B, 400 or 600.

In some embodiments, the set of conductive feature patterns 330 is located on a seventh layout level. In some embodiments, the seventh layout level is different from at least one of the first layout level, the second layout level, the third layout level, the fourth layout level, the fifth layout level or the sixth layout level. In some embodiments, the seventh layout level corresponds to the M0 level of one or more of layout design 300 or 500 or integrated circuits 100, 200A, 200B, 400 or 600. In some embodiments, the M0 level is above the OD level, the POLY level, the MD level, the BMD level and the BM0 level.

In some embodiments, the set of conductive feature patterns 330 correspond to 4 M0 routing tracks. Other numbers of M0 routing tracks are within the scope of the present disclosure.

Other configurations, arrangements on other layout levels or quantities of patterns in the set of conductive feature patterns 330 are within the scope of the present disclosure.

Layout design 300 further includes one or more conductive feature patterns 332*a*, 332*b*, 332*c*, 332*d*, 332*e*, 332*f* (collectively referred to as a "set of conductive feature patterns 332") extending in the first direction X.

Each conductive feature pattern in the set of conductive feature patterns 332 is separated from another conductive feature pattern in the set of conductive feature patterns 332 in the second direction Y.

The set of conductive feature patterns 332 is overlapped by at least one of the set of active region patterns 302 or 304, the set of gate patterns 306 or 308 or the set of contact patterns 310, 312, 314 or 316.

The set of conductive feature patterns 330 and 332 are separated from one another in the third direction Z. In some embodiments, conductive feature patterns 330a and 332a are separated from one another in the third direction Z. In some embodiments, conductive feature patterns 330b and 332b are separated from one another in the third direction Z. In some embodiments, conductive feature patterns 330c and 332c are separated from one another in the third direction Z. In some embodiments, conductive feature patterns 330d and 332d are separated from one another in the third direction Z. In some embodiments, conductive feature patterns 330e and 332e are separated from one another in the third direction Z. In some embodiments, conductive feature patterns 330f and 332f are separated from one another in the third direction Z.

The set of conductive feature patterns 332 is usable to manufacture a corresponding set of conductors 432 of integrated circuit 100, 200A, 200B, 400 or 600. Conductive feature patterns 332a, 332b, 332c, 332d, 332c, 332f are usable to manufacture corresponding conductors 432a, 432b, 432c, 432d, 432e, 432f of integrated circuit 100, 200A, 200B, 400 or 600. In some embodiments, at least one conductor of the set of conductors 432 is located on the back-side 403b of integrated circuit 100, 200A, 200B, 400 or 600.

In some embodiments, the set of conductive feature patterns 332 is located on an eighth layout level. In some embodiments, the eighth layout level is different from at least one of the first layout level, the second layout level, the third layout level, the fourth layout level, the fifth layout level, the sixth layout level or the seventh layout level. In some embodiments, the eighth layout level corresponds to the BM0 level of one or more of layout design 300 or 500 or integrated circuits 100, 200A, 200B, 400 or 600. In some embodiments, the BM0 level is below the OD level, the POLY level, the MD level and the BMD level.

In some embodiments, the set of conductive feature patterns 332 correspond to 4 BM0 routing tracks. Other numbers of BM0 routing tracks are within the scope of the present disclosure.

Other configurations, arrangements on other layout levels or quantities of patterns in the set of conductive feature patterns 332 are within the scope of the present disclosure.

Layout design 300 further includes one or more via patterns 320a, 320b, 320c, 320d (collectively referred to as a "set of via patterns 320").

The set of via patterns 320 is usable to manufacture a corresponding set of vias 420 of integrated circuit 100, 200A, 200B, 400 or 600. In some embodiments, via patterns 320a, 320b, 320c, 320d of the set of via patterns 320 are usable to manufacture corresponding vias 420a, 420b, 420c, 420d of the set of vias 420 of integrated circuit 100, 200A, 200B, 400 or 600.

In some embodiments, the set of via patterns 320 is between the set of contact patterns 310 and the set of conductive feature patterns 330. Via pattern 320a is between contact pattern 310a and conductive feature pattern 330a. Via pattern 320b is between contact pattern 310b and conductive feature pattern 330c. Via pattern 320c is between contact pattern 310c and conductive feature pattern 330d.

Via pattern 320d is between contact pattern 310d and conductive feature pattern 330f.

The set of via patterns 320 is positioned at a via over diffusion (VD) level of one or more of layout design 300 or 500 or integrated circuits 100, 200A, 200B, 400 or 600. In some embodiments, the VD level is above the OD level, the POLY level, the MD level, the BMD level and the BM0 level. In some embodiments, the VD level is below the M0 level. In some embodiments, the VD level is between the MD level and the M0 level. In some embodiments, the VD level is between the third layout level and the seventh layout level. Other layout levels are within the scope of the present disclosure.

Other configurations, arrangements on other layout levels or quantities of patterns in at least set of via patterns 320 are within the scope of the present disclosure.

Layout design 300 further includes one or more via patterns 322a, 322b, 322c, 322d (collectively referred to as a "set of via patterns 322").

The set of via patterns 322 is usable to manufacture a corresponding set of vias 422 of integrated circuit 100, 200A, 200B, 400 or 600. In some embodiments, via patterns 322a, 322b, 322c, 322d of the set of via patterns 322 are usable to manufacture corresponding vias 422a, 422b, 422c, 422d of the set of vias 422 of integrated circuit 100, 200A, 200B, 400 or 600.

In some embodiments, the set of via patterns 322 is between the set of contact patterns 312 and the set of conductive feature patterns 332. Via pattern 322a is between contact pattern 312a and conductive feature pattern 332a. Via pattern 322b is between contact pattern 312b and conductive feature pattern 332c. Via pattern 322c is between contact pattern 312c and conductive feature pattern 332d. Via pattern 322d is between contact pattern 312d and conductive feature pattern 332f.

The set of via patterns 322 is positioned at a back-side via over diffusion (BVD) level of one or more of layout design 300 or 500 or integrated circuits 100, 200A, 200B, 400 or 600. In some embodiments, the BVD level is below the OD level, the POLY level, the MD level, the BMD level and the M0 level. In some embodiments, the BVD level is above the BM0 level. In some embodiments, the BVD level is between the BMD level and the BM0 level. In some embodiments, the BVD level is between the fourth layout level and the eighth layout level. Other layout levels are within the scope of the present disclosure.

Other configurations, arrangements on other layout levels or quantities of patterns in at least set of via patterns 322 are within the scope of the present disclosure.

Layout design 300 further includes one or more via patterns 324a, 324b (collectively referred to as a "set of via patterns 324").

The set of via patterns 324 is usable to manufacture a corresponding set of vias 424 of integrated circuit 100, 200A, 200B, 400 or 600. In some embodiments, via patterns 324a, 324b of the set of via patterns 324 are usable to manufacture corresponding vias 424a, 424b of the set of vias 424 of integrated circuit 100, 200A, 200B, 400 or 600.

In some embodiments, the set of via patterns 324 is between the set of gate patterns 306 and the set of conductive feature patterns 330. Via pattern 324a is between gate pattern 306b and conductive feature pattern 330b. Via pattern 324b is between gate pattern 306c and conductive feature pattern 330c.

The set of via patterns 324 is positioned at a via over gate (VG) level of one or more of layout design 300 or 500 or integrated circuits 100, 200A, 200B, 400 or 600. In some embodiments, the VG level is above the OD level, the POLY level, the MD level, the MDLI level, the BCT level, the BMD level, the BM0 level and the BM1 level. In some embodiments, the VG level is below the M0 level. In some embodiments, the VG level is between the POLY level and the M0 level. In some embodiments, the VG level is between the second layout level and the seventh layout level. Other layout levels are within the scope of the present disclosure.

Other configurations, arrangements on other layout levels or quantities of patterns in at least set of via patterns 324 are within the scope of the present disclosure.

Layout design 300 further includes one or more via patterns 326a, 326b (collectively referred to as a "set of via patterns 326").

The set of via patterns 326 is usable to manufacture a corresponding set of vias 426 of integrated circuit 100, 200A, 200B, 400 or 600. In some embodiments, via patterns 326a, 326b of the set of via patterns 326 are usable to manufacture corresponding vias 426a, 426b of the set of vias 426 of integrated circuit 100, 200A, 200B, 400 or 600.

In some embodiments, the set of via patterns 326 is between the set of gate patterns 308 and the set of conductive feature patterns 332. Via pattern 326a is between gate pattern 308b and conductive feature pattern 332b. Via pattern 326b is between gate pattern 308c and conductive feature pattern 332c.

The set of via patterns 326 is positioned at a back-side via over gate (BVG) level of one or more of layout design 300 or 500 or integrated circuits 100, 200A, 200B, 400 or 600. In some embodiments, the BVG level is below the OD level, the POLY level, the MD level, the MDLI level, the BCT level, the BMD level and the M0 level. In some embodiments, the BVG level is above the BM0 level. In some embodiments, the BVG level is between the POLY level and the BM0 level. In some embodiments, the BVG level is between the second layout level and the eighth layout level. Other layout levels are within the scope of the present disclosure.

Other configurations, arrangements on other layout levels or quantities of patterns in at least set of via patterns 326 are within the scope of the present disclosure.

FIG. 3B is a diagram of a portion 300B of layout design 300, simplified for case of illustration.

Portion 300B is a variation of portion 300A of layout design 300, and similar detailed description is omitted for brevity.

Portion 300B includes a region 350a1, a region 350b1 and a region 350c1.

Region 350al is portion 300A of FIG. 3A, and similar detailed description is omitted for brevity.

Region 350b1 identifies M0 track usage for the set of conductive feature patterns 330. Stated differently, region 350b1 identifies M0 signals for corresponding conductive feature patterns in the set of conductive feature patterns 330 for the front-side of integrated circuit 400. For example, conductive feature pattern 330a is useable for the reference supply voltage VSS, conductive feature pattern 330b is useable for the word line WL_FS, conductive feature pattern 330c is usable for the bit line BL_FS, conductive feature pattern 330d is usable for the bit line bar BLB_FS, conductive feature pattern 330e is useable for the word line WL_FS, and conductive feature pattern 330f is usable for the reference supply voltage VSS, and in accordance with some embodiments.

Region 350cl identifies BM0 track usage for the set of conductive feature patterns 332. Stated differently, region 350cl identifies BM0 signals for corresponding conductive feature patterns in the set of conductive feature patterns 332 for the back-side of integrated circuit 400. For example, conductive feature pattern 332a is useable for the supply voltage VDD, conductive feature pattern 332b is useable for the word line WL_BS, conductive feature pattern 332c is usable for the bit line BL_BS, conductive feature pattern 332d is usable for the bit line bar BLB_BS, conductive feature pattern 332e is usable for the word line WL_BS, and conductive feature pattern 332f is usable for the supply voltage VDD, and in accordance with some embodiments.

Other M0 track assignments are within the scope of the present disclosure.

FIG. 3C is a diagram of a portion 300C of layout design 300, simplified for case of illustration.

Portion 300C includes a region 350a2 and region 350b1.

Portion 300C is a variation of portion 300B, and similar detailed description is omitted for brevity. In comparison with portion 300B, region 350a2 of portion 300C replaces region 350al of FIG. 3B, and similar detailed description is omitted for brevity. In comparison with portion 300B, portion 300C does not include region 350c1, and similar detailed description is omitted for brevity.

Region 350a2 includes the set of active region patterns 302 and 304, the set of gate patterns 306 and 308, the set of contact patterns 310, 314 and 316, the set of via patterns 320 and 324, and the set of conductive feature patterns 330.

Other M0 track assignments are within the scope of the present disclosure.

FIG. 3D is a diagram of a portion 300D of layout design 300, simplified for ease of illustration.

Portion 300D includes a region 350a3 and a region 350c1.

Portion 300D is a variation of portion 300B, and similar detailed description is omitted for brevity. In comparison with portion 300B, region 350a3 of portion 300D replaces region 350al of FIG. 3B, and similar detailed description is omitted for brevity. In comparison with portion 300B, portion 300D does not include region 350b1, and similar detailed description is omitted for brevity.

Region 350a3 includes the set of active region patterns 302 and 304, the set of gate patterns 306 and 308, the set of contact patterns 312, 314 and 316, the set of via patterns 322 and 326, and the set of conductive feature patterns 332.

Other M0 track assignments are within the scope of the present disclosure.

In some embodiments, by including the set of insulating region patterns 394 in layout design 300, gate pattern 306b and 308b are separated from each other by insulating region pattern 394b, thereby allowing NFET transistor N2-3 and PFET transistor P2-3 to be used as pass gate transistors of different corresponding ports of a dual-port memory cell manufactured by layout design 300, thereby resulting in a layout design of a dual-port memory cell that occupies less area than other approaches.

In some embodiments, by including the set of insulating region patterns 394 in layout design 300, gate pattern 306c and 308c are separated from each other by insulating region pattern 394a, thereby allowing NFET transistor N2-4 and PFET transistor P2-4 to be used as pass gate transistors of different corresponding ports of a dual-port memory cell manufactured by layout design 300, thereby resulting in a layout design 300 of a dual-port memory cell that occupies less area than other approaches.

In some embodiments, by including the set of insulating region patterns 394 in layout design 300 causes layout design 300 to include less active region (OD) tracks than other approaches resulting in a layout design 300 of a dual port memory cell that occupies less area than other approaches.

Other configurations, arrangements on other layout levels or quantities of patterns in layout design 300 are within the scope of the present disclosure.

FIGS. 4A-4I are diagrams of an integrated circuit 400, in accordance with some embodiments.

FIGS. 4A-4D are corresponding diagrams of corresponding portions 400A-400D of an integrated circuit 400, simplified for ease of illustration.

Portion 400A includes one or more features of integrated circuit 400 of the OD level, the POLY level, the MD level, the MDLI level, the BCT level, the M0 level, the VG level, the VD level, the BMD level, the BM0 level, the BVG level, and the BVD level. Portion 400A is manufactured by portion 300A.

Portion 400B includes one or more features of integrated circuit 400 of the OD level, the POLY level, the MD level, the MDLI level, the BCT level, the M0 level, the VG level, the VD level, the BMD level, the BM0 level, the BVG level, and the BVD level. Portion 400B is manufactured by portion 300B.

Portion 400C includes one or more features of integrated circuit 400 of the OD level, the POLY level, the MD level, the MDLI level, the BCT level, the M0 level, the VG level and the VD level. Portion 400C is manufactured by portion 300C.

Portion 400D include one or more features of integrated circuit 400 of the OD level, the POLY level, the BMD level, the MDLI level, the BCT level, the BM0 level, the BVG level, and the BVD level. Portion 400D is manufactured by portion 300D.

Figure 4E:
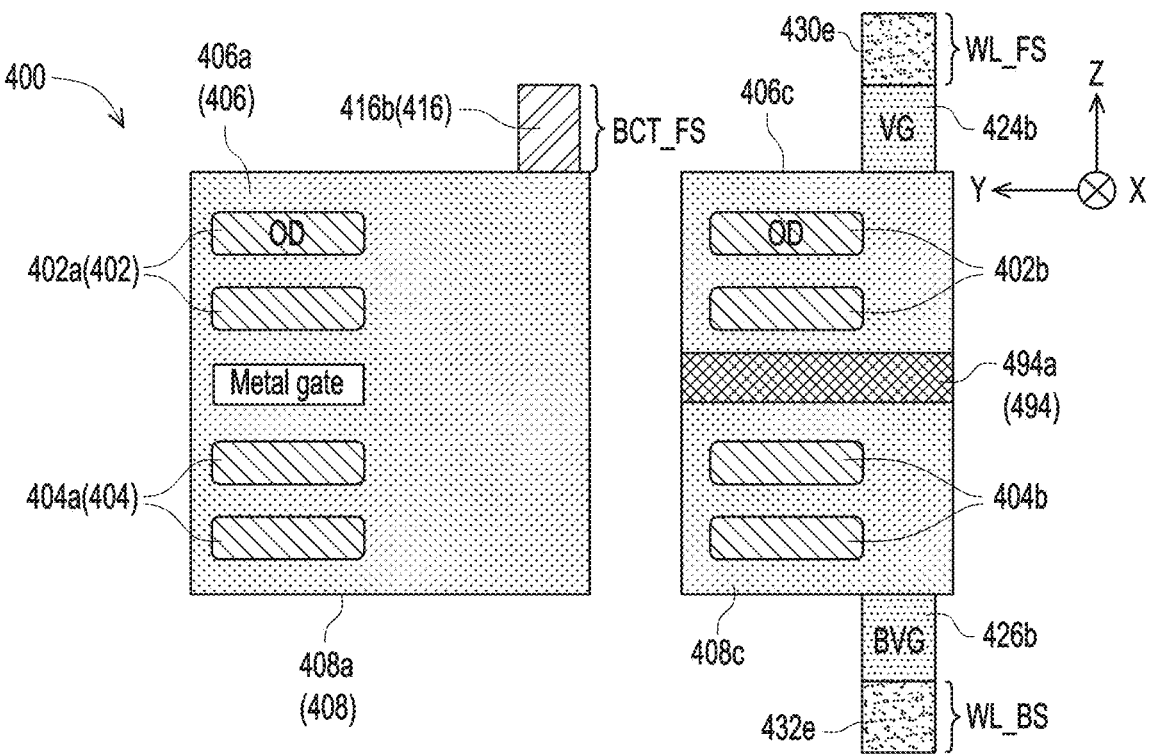
Figure 4F:
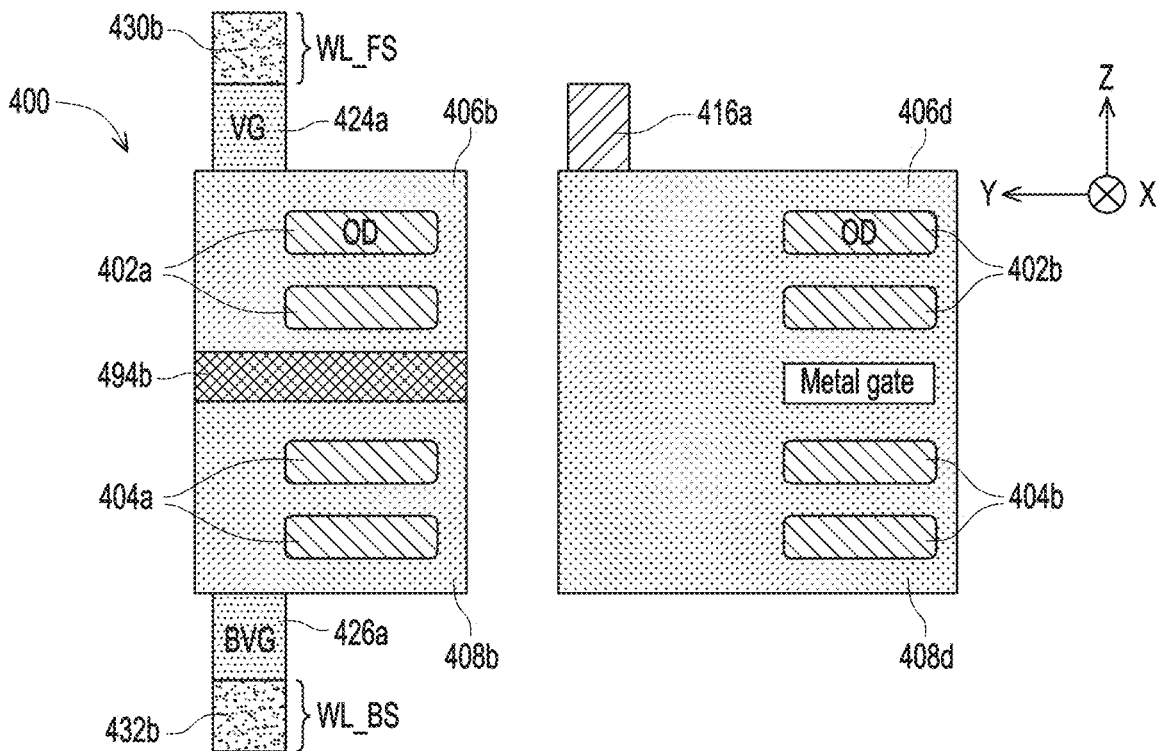
Figure 4G:
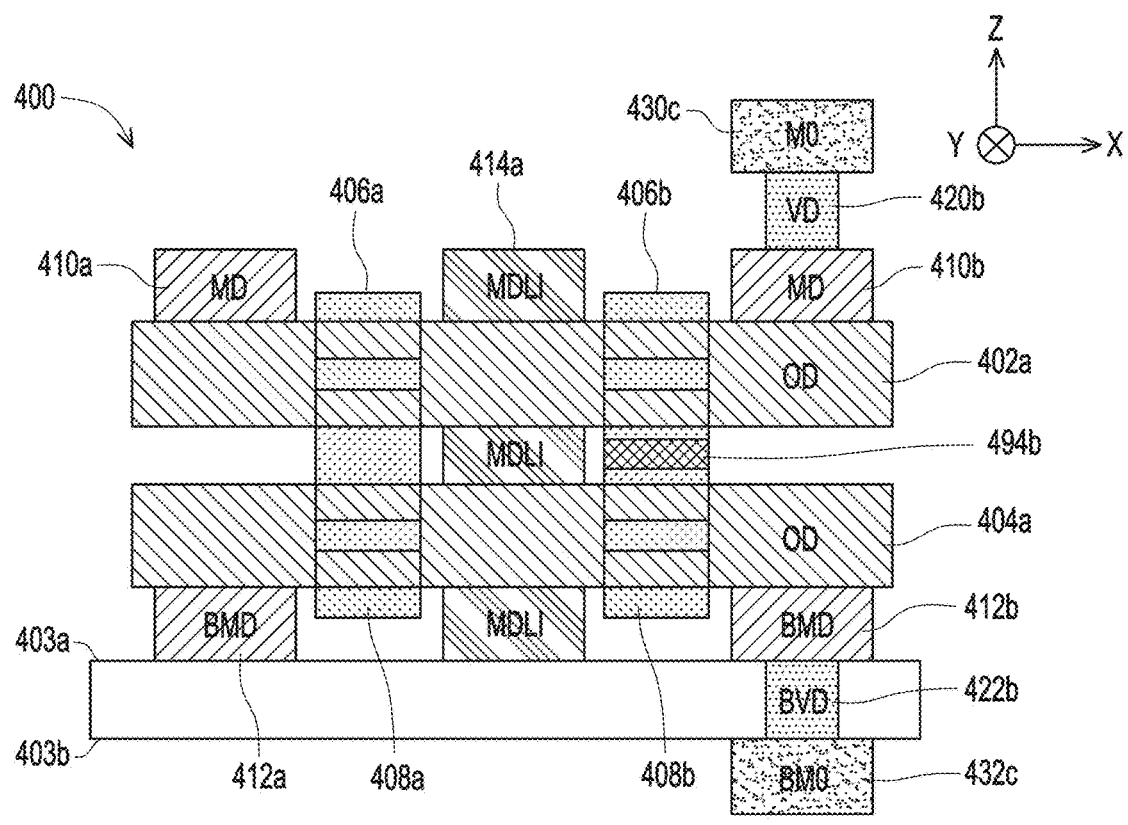
Figure 4H:
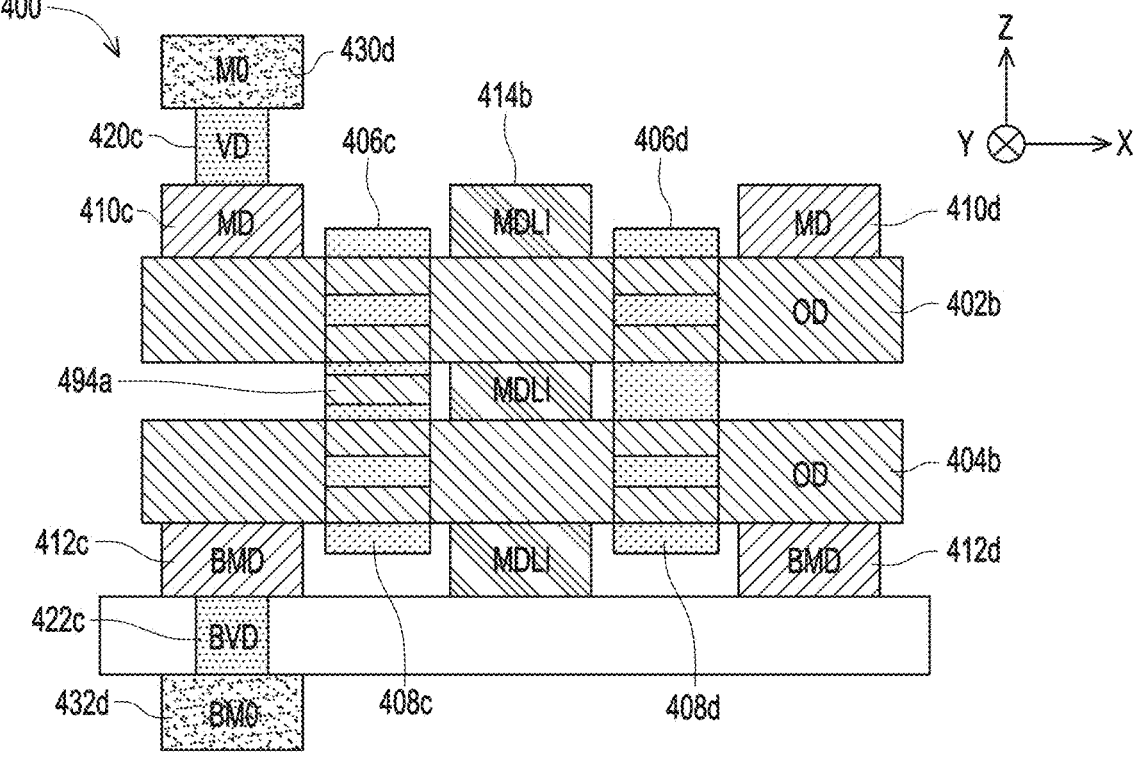
Figure 4I:
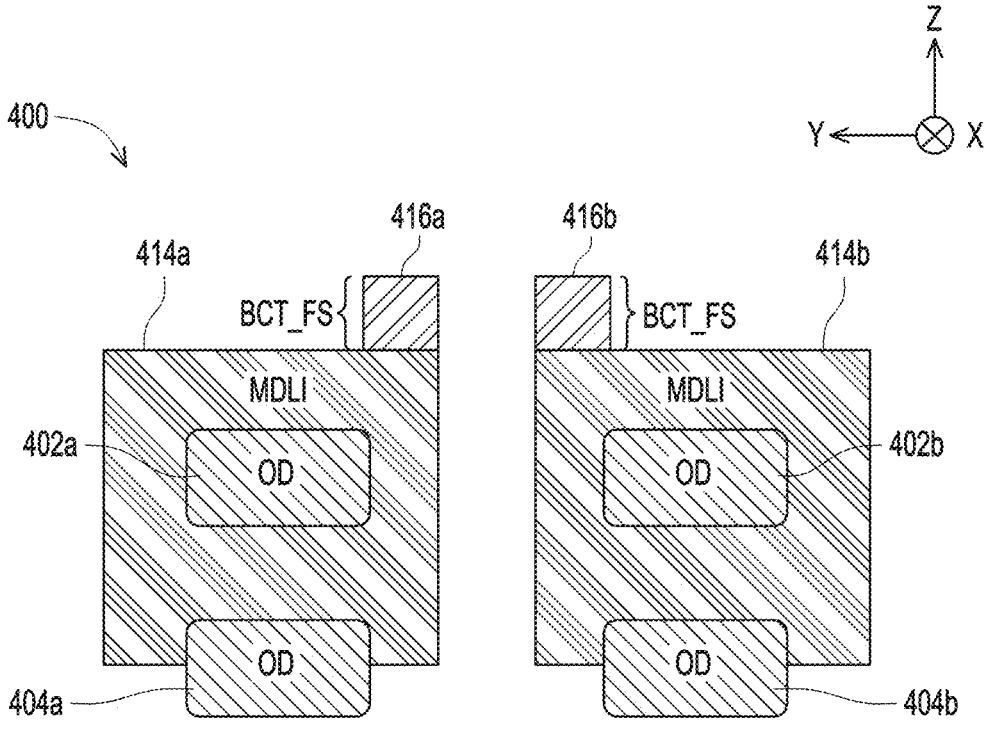

FIGS. 4E-4I are corresponding cross-sectional views of integrated circuit 400, in accordance with some embodiments. FIG. 4E is a cross-sectional view of integrated circuit 400 as intersected by plane A-A', in accordance with some embodiments. FIG. 4F is a cross-sectional view of integrated circuit 400 as intersected by plane B-B', in accordance with some embodiments. FIG. 4G is a cross-sectional view of integrated circuit 400 as intersected by plane C-C', in accordance with some embodiments. FIG. 4H is a cross-sectional view of integrated circuit 400 as intersected by plane D-D', in accordance with some embodiments. FIG. 4I is a cross-sectional view of integrated circuit 400 as intersected by plane E-E', in accordance with some embodiments.

Components that are the same or similar to those in one or more of FIGS. 1, 2A-2B, 3A-3D, 4A-4I, 5 and 6 are given the same reference numbers, and detailed description thereof is thus omitted.

Integrated circuit 400 is manufactured by layout design 300. Integrated circuit 400 is cell 401. Structural relationships including alignment, lengths and widths, as well as configurations and layers of integrated circuit 400 and 600 are similar to the structural relationships and configurations and layers of layout design 300 or 500 of FIGS. 3A-3D and 5, and similar detailed description will not be described in at least FIGS. 4A-4I, for brevity. For example, in some embodiments, at least one or more widths, lengths or pitches of layout design 300 or 500 is similar to corresponding widths, lengths or pitches of integrated circuit 400 and 600, and similar detailed description is omitted for brevity. For example, in some embodiments, at least cell boundary 301a or 301b is similar to at least corresponding cell boundary 401a or 401b of integrated circuit 400, and similar detailed description is omitted for brevity.

Integrated circuit 400 includes at least the set of active regions 402 and 404, the set of gates 406 and 408, the set of contacts 410, the set of contacts 412, the set of contacts 414, the set of contacts 416, the set of conductors 430, the set of conductors 432, the set of vias 420, the set of vias 422, the set of vias 424, the set of vias 426, a substrate 490, an insulating region 492 and a set of insulating regions 494.

The set of active regions 402 and 404 are embedded in substrate 490. Substrate 490 has a front-side 403a and a back-side 403b opposite from the front-side 403a. In some embodiments, at least the set of active regions 402 and 404, the set of gates 406 and 408 or the set of contacts 410, 412, 414 and 416 are formed in the front-side 403a of substrate 490.

In some embodiments, the set of active regions 402 and 404 correspond to active regions of CFET transistors. In some embodiments, the set of active regions 402 and 404 correspond to nanosheet structures (not labelled) of nanosheet transistors. In some embodiments, the set of active regions 402 include drain regions and source regions grown by an epitaxial growth process. In some embodiments, the set of active regions 402 include drain regions and source regions that are grown with an epitaxial material at the corresponding drain regions and source regions.

Other transistor types are within the scope of the present disclosure. For example, in some embodiments, the set of active regions 402 corresponds to nanowire structures (not shown) of nanowire transistors. In some embodiments, the set of active regions 402 corresponds to planar structures (not shown) of planar transistors. In some embodiments, the set of active regions 402 corresponds to fin structures (not shown) of finFETs.

In some embodiments, active regions 402a and 402b correspond to source and drain regions of NFET transistors of integrated circuit 100, 200A, 200B, 400 or 600, and active regions 404a and 404b correspond to source and drain regions of PFET transistors of integrated circuit 100, 200A, 200B, 400 or 600.

In some embodiments, active regions 402a and 402b correspond to source and drain regions of PFET transistors of integrated circuit 100, 200A, 200B, 400 or 600, and active regions 404a and 404b correspond to source and drain regions of NFET transistors of integrated circuit 100, 200A, 200B, 400 or 600.

In some embodiments, at least active region 402a or 402b is an N-type doped S/D region, and at least active region 404a or 404b is a P-type doped S/D region embedded in a dielectric material of substrate 490. In some embodiments, at least active region 402a or 402b is a P-type doped S/D region, and at least active region 404a or 404b is an N-type doped S/D region embedded in a dielectric material of substrate 490.

Other configurations, arrangements on other layout levels or quantities of structures in the set of active regions 402 or 404 are within the scope of the present disclosure.

Figure 7:
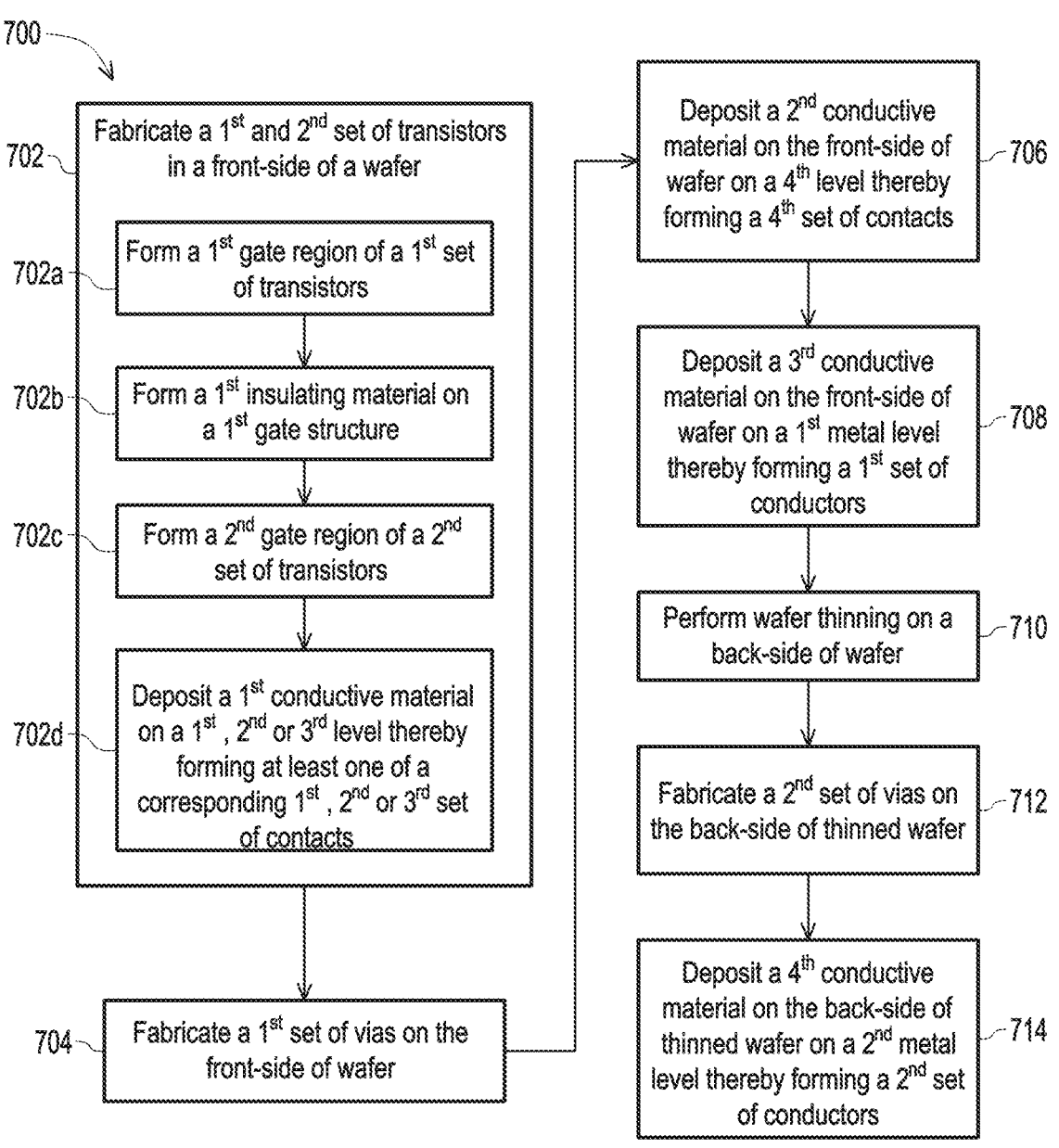
FIG. 7 is a functional flow chart of a method of manufacturing an integrated circuit, in accordance with some embodiments.

Insulating region 492 is configured to electrically isolate one or more elements of the set of active regions 402 and 404, the set of gates 406 and 408, the set of contacts 410, the set of contacts 412, the set of contacts 414, the set of contacts 416, the set of conductors 430, the set of conductors 432, the set of vias 420, the set of vias 422, the set of vias 424, the set of vias 426 from one another. In some embodiments, insulating region 492 includes multiple insulating regions deposited at different times from each other during method 700 (FIG. 7). In some embodiments, insulating region 492 is a dielectric material. In some embodiments, the dielectric material includes silicon dioxide, silicon oxy-nitride, or the like.

Other configurations, arrangements on other layout levels or other numbers of portions in insulating region 492 are within the scope of the present disclosure.

The set of gates 406 and 408 correspond to one or more gates of transistors N2-1, P2-1, N2-2, P2-2, N2-3, P2-3, N2-4, P2-4 of integrated circuits 100, 200A, 200B, 400 or 600. In some embodiments, each of the gates in the set of gates 406 and 408 are shown in FIGS. 4A-4F with labels "N2-1, P2-1, N2-2, P2-2, N2-3, P2-3, N2-4, P2-4" that identify corresponding transistors of FIGS. 2A-2B having corresponding gates in FIGS. 4A-4I and 6, and are omitted for brevity.

In some embodiments, gate 406a is a gate of NFET transistor N2-1, gate 408a is a gate of PFET transistor P2-1, gate 406b is a gate of NFET transistor N2-3, gate 408b is a gate of PFET transistor P2-3, gate 406c is a gate of NFET transistor N2-4, gate 408c is a gate of PFET transistor P2-4, gate 406d is a gate of NFET transistor N2-2, and gate 408d is a gate of PFET transistor P2-2.

In some embodiments, gate 406a and gate 408a are coupled together. In some embodiments, gate 406a and gate 408a are part of the same continuous structure. In some embodiments, gate 406d and gate 408d are coupled together. In some embodiments, gate 406d and gate 408d are part of the same continuous structure.

In some embodiments, gate 406b and gate 408b are separated from each other in the third direction Z. In some embodiments, gate 406b and gate 408b are separated from each other in the third direction Z by an insulating region 494b of the set of insulating regions 494.

In some embodiments, gate 406c and gate 408c are separated from each other in the third direction Z. In some embodiments, gate 406c and gate 408c are separated from each other in the third direction Z by an insulating region 494a of the set of insulating regions 494.

In some embodiments, the set of gates 406 or 408 encapsulates the set of active regions 402 or 404.

Other configurations, arrangements on other layout levels or quantities of gates in the set of gates 406 and 408 are within the scope of the present disclosure.

The set of insulating regions 494 includes at least one of insulating region 494a or 494b. In some embodiments, the set of insulating regions 494 are also referred to as a set of gate isolation layers. In some embodiments, at least one of insulating region 494a or 494b is referred to as a gate isolation layer.

The set of insulating regions 494 is configured to electrically isolate one or more gates of the set of gates 406 or 408 from another gate of the set of gates 406 or 408.

In some embodiments, insulating region 494a is configured to electrically isolate gate 406c and gate 408c from each other. In some embodiments, insulating region 494b is configured to electrically isolate gate 406b and gate 408b from each other.

In some embodiments, set of insulating regions 494a or 494b includes a single insulating region deposited at a single instant of time during method 700 (FIG. 7). In some embodiments, insulating region 494a or 494b includes multiple insulating regions deposited at different times from each other during method 700 (FIG. 7). In some embodiments, insulating region 494 is a dielectric material. In some embodiments, the dielectric material includes silicon dioxide, silicon oxy-nitride, or the like.

Other configurations, arrangements on other layout levels or other numbers of portions in the set of insulating regions 494 are within the scope of the present disclosure.

Each contact of the set of contacts 410 or 412 corresponds to one or more drain or source terminals of transistors N2-1, P2-1, N2-2, P2-2, N2-3, P2-3, N2-4, P2-4 of integrated circuits 100, 200A, 200B, 400 or 600. In some embodiments, one or more contacts of the set of contacts 410 or 412 overlaps a pair of active regions of the set of active regions 402 and 404, thereby electrically coupling the pair of active regions of the set of active regions 402 and 404, and the source or drain of the corresponding transistors.

In some embodiments, the set of contacts 410 or 412 encapsulates the set of active regions 402 or 404.

In some embodiments, contact 410a corresponds to the source terminal of NFET transistor N2-1. In some embodiments, contact 412a corresponds to the source terminal of PFET transistor P2-1.

In some embodiments, contact 410b corresponds to the source terminal of NFET transistor N2-3. In some embodiments, contact 412b corresponds to the source terminal of PFET transistor P2-3.

In some embodiments, contact 410c corresponds to the source terminal of NFET transistor N2-4. In some embodiments, contact 412c corresponds to the source terminal of PFET transistor P2-4.

In some embodiments, contact 410d corresponds to the source terminal of NFET transistor N2-2. In some embodiments, contact 412d corresponds to the source terminal of PFET transistor P2-2.

In some embodiments, contact 414a corresponds to the drain terminals of NFET transistors N2-1 and N2-3, and the drain terminals of PFET transistors P2-1 and P2-3.

In some embodiments, contact 414b corresponds to the drain terminals of NFET transistors N2-4 and N2-2, and the drain terminals of PFET transistors P2-4 and P2-2.

In some embodiments, contact 416a is in direct contact with at least one of gate 406d, gate 408d or contact 414a. In some embodiments, contact 416a couples gate 406d and gate 408d with contact 414a, thereby electrically coupling the gate terminals of transistors N2-2 and P2-2 with the drain terminals of transistors N2-1 and P2-1 and transistors N2-3 and P2-3 together.

In some embodiments, contact 416b is in direct contact with at least one of gate 406a, gate 408a or contact 414b. In some embodiments, contact 416b couples gate 406a and gate 408a with contact 414b, thereby electrically coupling the gate terminals of transistors N2-1 and P2-1 with the drain terminals of transistors N2-4 and P2-4 and transistors N2-2 and P2-2 together.

Other configurations, arrangements on other layout levels or quantities of contacts in the set of contacts 410, 412, 414 and 416 are within the scope of the present disclosure.

The set of conductors 420 and 422 are M0 routing tracks. In some embodiments, the set of conductors 420 and 422 are routing tracks in other layers. In some embodiments, the set of conductors 420 or 422 corresponds to 4 M0 routing tracks.

In some embodiments, the set of conductors 430 corresponds to at least one of the bit line BL_FS, the bit line bar BLB_FS or the word line WL_FS. In some embodiments, the set of conductors 430 is configured to supply the reference supply voltage VSS.

In some embodiments, the set of conductors 432 corresponds to at least one of the bit line BL_BS, the bit line bar BLB_BS or the word line WL_BS. In some embodiments, the set of conductors 432 is configured to supply the supply voltage VDD.

In some embodiments, conductor 430a is configured to supply the reference supply voltage VSS, conductor 430b is the word line WL_FS, conductor 430c is the bit line BL_FS, conductor 430d is the bit line bar BLB_FS, conductor 430e is the word line WL_FS, and conductor 430f is configured to supply the reference supply voltage VSS.

In some embodiments, conductor 432a is configured to supply the supply voltage VDD, conductor 432b is the word line WL_BS, conductor 432c is the bit line BL_BS, conductor 432d is the bit line bar BLB_BS, conductor 432e is the word line WL_BS, and conductor 432f is configured to supply the supply voltage VDD.

Other configurations, arrangements on other layout levels or quantities of conductors in the set of conductors 430 and 432 are within the scope of the present disclosure.

The set of vias 420 is configured to electrically couple a corresponding source or drain region of the set of active regions 402 to the set of conductors 430 by the set of contacts 410, and vice versa. The set of vias 420 is between the set of contacts 410 and the set of conductors 430.

The set of vias 422 is configured to electrically couple a corresponding source or drain region of the set of active regions 404 to the set of conductors 432 by the set of contacts 412, and vice versa. The set of vias 422 is between the set of contacts 412 and the set of conductors 432.

The set of vias 424 is configured to electrically couple one or more gates of the set of gates 406 to the set of conductors 430, and vice versa. The set of vias 424 is between the set of gates 406 and the set of conductors 430.

The set of vias 426 is configured to electrically couple one or more gates of the set of gates 408 to the set of conductors 432, and vice versa. The set of vias 426 is between the set of gates 408 and the set of conductors 432.

Via 420a electrically couples conductor 430a and contact 410a together. Via 420b electrically couples conductor 430c and contact 410b together. Via 420c electrically couples conductor 430d and contact 410c together. Via 420d electrically couples conductor 430f and contact 410d together.

Via 422a electrically couples conductor 432a and contact 412a together. Via 422b electrically couples conductor 432c and contact 412b together. Via 422c electrically couples conductor 432d and contact 412c together. Via 422d electrically couples conductor 432f and contact 412d together.

Via 424a electrically couples conductor 430b and gate 406b together. Via 424b electrically couples conductor 430e and gate 406c together.

Via 426a electrically couples conductor 432b and gate 408b together. Via 426b electrically couples conductor 432e and gate 408c together.

Other configurations, arrangements on other layout levels or quantities of vias in the set of vias 420, 422, 424 and 426 are within the scope of the present disclosure.

FIG. 4B is a diagram of a portion 400B of integrated circuit 400, simplified for case of illustration.

Portion 400B is a variation of integrated circuit 400A, and similar detailed description is omitted for brevity.

Portion 400B includes a region 450a1, a region 450b1 and a region 450cl.

Region 450al is portion 400A of FIG. 4A, and similar detailed description is omitted for brevity.

Region 450b1 identifies M0 track usage for the set of conductors 430. Stated differently, region 450b1 identifies M0 signals for corresponding conductors in the set of conductors 430 for the front-side of integrated circuit 400.

For example, conductor 430a is useable for the reference supply voltage VSS, conductor 430b is useable for the word line WL_FS, conductor 430c is useable for the bit line BL_FS, conductor 430d is useable for the bit line bar BLB_FS, conductor 430e is useable for the word line WL_FS, and conductor 430f is useable for the reference supply voltage VSS, and in accordance with some embodiments.

Region 450cl identifies BM0 track usage for the set of conductors 432. Stated differently, region 450cl identifies BM0 signals for corresponding conductors in the set of conductors 432 for the back-side of integrated circuit 400. For example, conductor 432a is useable for the supply voltage VDD, conductor 432b is useable for the word line WL_BS, conductor 432c is useable for the bit line BL_BS, conductor 432d is useable for the bit line bar BLB_BS, conductor 432e is useable for the word line WL_BS, and conductor 432f is useable for the supply voltage VDD, and in accordance with some embodiments.

Other M0 track assignments are within the scope of the present disclosure.

FIG. 4C is a diagram of a portion 400C of integrated circuit 400, simplified for ease of illustration.

Portion 400C includes a region 450a2 and region 450b1.

Portion 400C is a variation of portion 400B, and similar detailed description is omitted for brevity. In comparison with portion 400B, region 450a2 of portion 400C replaces region 450al of FIG. 4B, and similar detailed description is omitted for brevity. In comparison with portion 400B, portion 400C does not include region 450c1, and similar detailed description is omitted for brevity.

Region 450a2 includes the set of active regions 402 and 404, the set of gates 406 and 408, the set of contacts 410, 414 and 416, the set of vias 420 and 424, and the set of conductors 430.

Other M0 track assignments are within the scope of the present disclosure.

FIG. 4D is a diagram of a portion 400D of integrated circuit 400, simplified for ease of illustration.

Portion 400D includes a region 450a3 and region 450b1.

Portion 400D is a variation of portion 400B, and similar detailed description is omitted for brevity. In comparison with portion 400B, region 450a3 of portion 400D replaces region 450al of FIG. 4B, and similar detailed description is omitted for brevity. In comparison with portion 400B, portion 400D does not include region 450b1, and similar detailed description is omitted for brevity.

Region 450a3 includes the set of active regions 402 and 404, the set of gates 406 and 408, the set of contacts 412, 414 and 416, the set of vias 422 and 426, and the set of conductors 432.

Other M0 track assignments are within the scope of the present disclosure.

In some embodiments, at least one gate of the set of gates 406 or 408 are formed using a doped or non-doped polycrystalline silicon (or polysilicon). In some embodiments, at least one gate of the set of gates 406 or 408 include a metal, such as Al, Cu, W, Ti, Ta, TiN, TaN, NiSi, CoSi, other suitable conductive materials, or combinations thereof.

In some embodiments, at least one contact of the set of contacts 410, 412, 414 or 416, or at least one conductor of the set of conductors 430 or 432, or at least one via of the set of vias 420, 422, 424 or 426 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co. W. Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

In some embodiments, the gate isolation layer 494$b$ electrically insulates gate 406$b$ and gate 408$b$ from each other. In some embodiments, the gate isolation layer 494$a$ electrically insulates gate 406$c$ and gate 408$c$ from each other. In some embodiments, by electrically insulating gate 406$b$ and gate 408$b$ from each other, and electrically insulating gate 406$c$ and gate 408$c$ from each other, memory cell 400 can be used as a dual-port memory cell with a first port and a second port that occupies less area than other approaches.

In some embodiments, by including the set of insulating regions 494 in memory cell 400, gate 406$b$ and 408$b$ are separated from each other by insulating region 494$b$, thereby allowing NFET transistor N2-3 and PFET transistor P2-3 to be used as pass gate transistors of different corresponding ports of a dual-port memory cell (e.g., memory cell 400), thereby resulting in a memory cell 400 that occupies less area than other approaches.

In some embodiments, by including the set of insulating regions 494 in memory cell 400, gate 406$c$ and 408$c$ are separated from each other by insulating region 494$a$, thereby allowing NFET transistor N2-4 and PFET transistor P2-4 to be used as pass gate transistors of different corresponding ports of a dual-port memory cell (e.g., memory cell 400), thereby resulting in a memory cell 400 that occupies less area than other approaches.

In some embodiments, by including the set of insulating regions 494 in memory cell 400 causes memory cell 400 to include less active region (OD) tracks than other approaches resulting in a memory cell 400 that occupies less area than other approaches.

Other configurations or arrangements of integrated circuit 400 are within the scope of the present disclosure.

Figure 5:
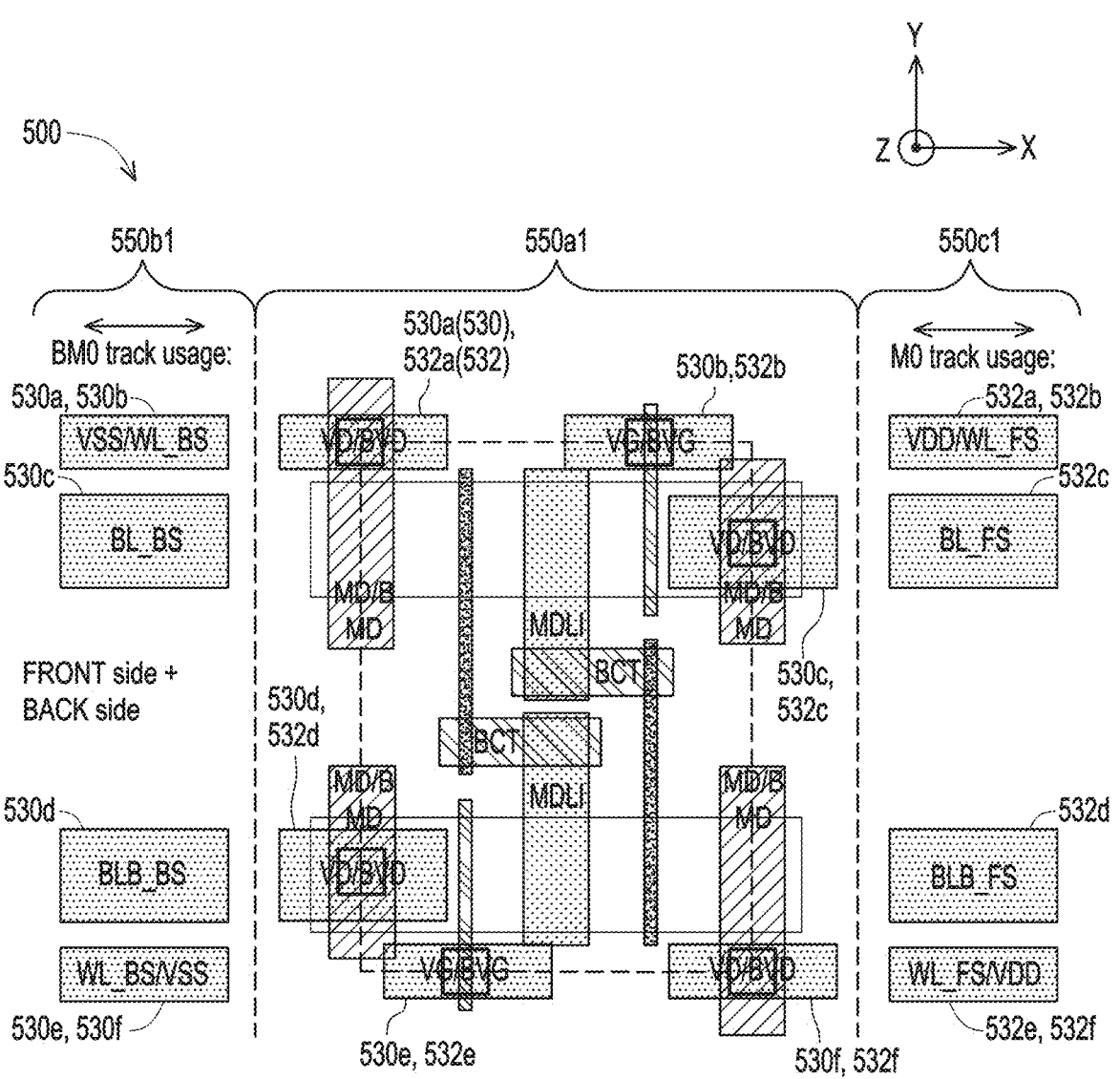
FIG. 5 is a diagram of a layout design of an integrated circuit, in accordance with some embodiments.

FIG. 5 is a diagram of a layout design 500 of an integrated circuit 600, in accordance with some embodiments.

Figure 6:
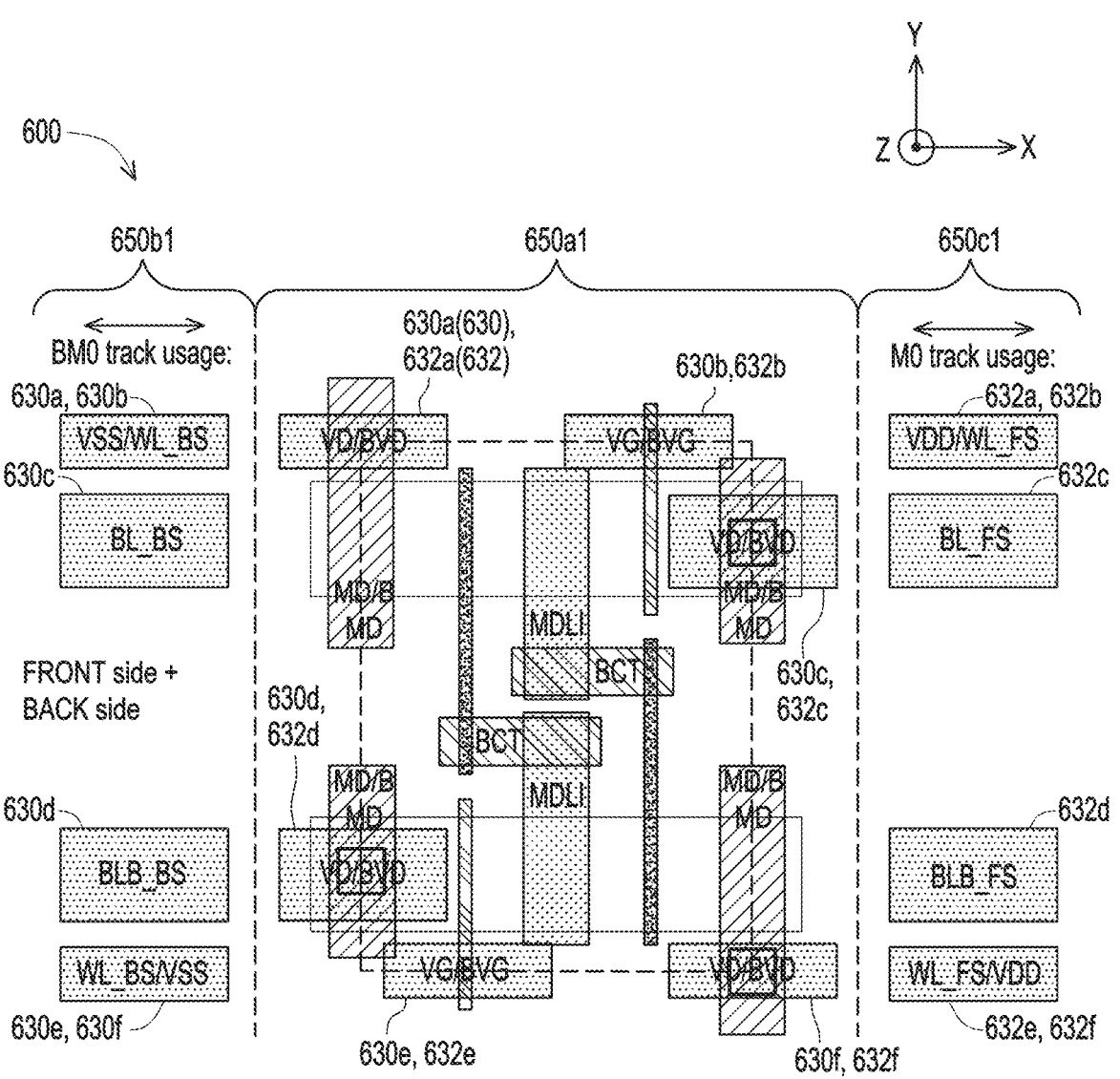
FIG. 6 is a diagram of an integrated circuit, in accordance with some embodiments.

Layout design 500 is a layout of an integrated circuit 600 of FIG. 6 or memory cell 200B. Layout design 300 is a layout of memory cell 200B of FIG. 2B.

Layout design 500 is a variation of layout design 300 of FIGS. 3A-3D, and similar detailed description is omitted for brevity.

In comparison with layout design 300 of FIGS. 3A-3D, a set of conductive feature patterns 530 replaces set of conductive feature patterns 330 of layout design 300, and a set of conductive feature patterns 532 replaces set of conductive feature patterns 332 of layout design 300, and similar detailed description is omitted for brevity.

In some embodiments, the set of active region patterns 302 in FIG. 5 corresponds to p-type transistors. In some embodiments, the set of active region patterns 302 in FIG. 5 corresponds to PFET transistors P2-1, P2-2, P2-3 and P2-4.

In some embodiments, the set of active region patterns 304 in FIG. 5 corresponds to N-type transistors. In some embodiments, the set of active region patterns 304 in FIG. 5 corresponds to NFET transistors N2-1, N2-2, N2-3 and N2-4.

Layout design 500 includes a region 550$a$1, a region 550$b$1 and a region 550$c$1.

In comparison with layout design 300 of FIGS. 3A-3D, region 550$a$l replaces region 350$a$l of layout design 300, region 550$b$1 replaces region 350$b$1 of layout design 300, region 550$c$l replaces region 350$c$l of layout design 300, and similar detailed description is omitted for brevity.

Region 550$a$l is similar to layout design 300 of FIGS. 3A-3D, but the set of conductive feature patterns 530 of region 550$a$l replaces set of conductive feature patterns 330 of layout design 300, and the set of conductive feature patterns 532 of region 550$a$l replaces set of conductive feature patterns 332 of layout design 300, and similar detailed description is omitted for brevity.

The set of conductive feature patterns 530 includes at least one of conductive feature pattern 530$a$, 530$b$, 530$c$, 530$d$, 530$c$ or 530$f$.

The set of conductive feature patterns 532 includes at least one of conductive feature pattern 532$a$, 532$b$, 532$c$, 532$d$, 532$e$ or 532$f$.

In comparison with layout design 300, conductive feature patterns 530$a$, 530$b$, 530$c$, 530$d$, 530$e$ or 530$f$ of the set of conductive feature patterns 530 replaces corresponding conductive feature patterns 330$a$, 330$b$, 330$c$, 330$d$, 330$e$ or 330$f$ of the set of conductive feature patterns 330, and similar detailed description is omitted for brevity.

In comparison with layout design 300, conductive feature patterns 532$a$, 532$b$, 532$c$, 532$d$, 532$e$ or 532$f$ of the set of conductive feature patterns 532 replaces corresponding conductive feature patterns 332$a$, 332$b$, 332$c$, 332$d$, 332$e$ or 332$f$ of the set of conductive feature patterns 332, and similar detailed description is omitted for brevity.

Region 550$b$1 identifies BM0 track usage for the set of conductive feature patterns 530. Stated differently, region 550$b$1 identifies BM0 signals for corresponding conductive feature patterns in the set of conductive feature patterns 530 for the back-side of integrated circuit 600. For example, conductive feature pattern 530$a$ is useable for the reference supply voltage VSS, conductive feature pattern 530$b$ is useable for the word line WL_BS, conductive feature pattern 530$c$ is usable for the bit line BL_BS, conductive feature pattern 530$d$ is usable for the bit line bar BLB_BS, conductive feature pattern 530$e$ is usable for the word line WL_BS, and conductive feature pattern 530$f$ is usable for the reference supply voltage VSS, and in accordance with some embodiments.

Region 550$c$l identifies M0 track usage for the set of conductive feature patterns 532. Stated differently, region 550$c$l identifies M0 signals for corresponding conductive feature patterns in the set of conductive feature patterns 532 for the front-side of integrated circuit 600. For example, conductive feature pattern 532$a$ is usable for the supply voltage VDD, conductive feature pattern 532$b$ is useable for the word line WL_FS, conductive feature pattern 532$c$ is usable for the bit line BL_FS, conductive feature pattern 532$d$ is useable for the bit line bar BLB_FS, conductive feature pattern 532$e$ is useable for the word line WL_FS, and conductive feature pattern 532$f$ is useable for the supply voltage VDD, and in accordance with some embodiments.

Other M0 track assignments are within the scope of the present disclosure.

In some embodiments, layout design 500 achieves one or more of the benefits described herein.

Other configurations, arrangements on other layout levels or quantities of patterns in layout design 500 are within the scope of the present disclosure.

FIG. 6 is a diagram of an integrated circuit 600, in accordance with some embodiments.

Integrated circuit 600 is manufactured by layout design 500. In some embodiments, integrated circuit 600 is memory cell 200B.

Integrated circuit 600 is a variation of integrated circuit 400 of FIGS. 4A-4I, and similar detailed description is omitted for brevity.

In comparison with integrated circuit 400 of FIGS. 4A-4I, a set of conductors 630 replaces set of conductors 430 of integrated circuit 400, and a set of conductors 632 replaces set of conductors 432 of integrated circuit 400, and similar detailed description is omitted for brevity.

In some embodiments, the set of active regions 402 in FIG. 6 corresponds to p-type transistors. In some embodiments, the set of active regions 402 in FIG. 6 corresponds to PFET transistors P2-1, P2-2, P2-3 and P2-4.

In some embodiments, the set of active regions 404 in FIG. 6 corresponds to N-type transistors. In some embodiments, the set of active regions 404 in FIG. 6 corresponds to NFET transistors N2-1. N2-2, N2-3 and N2-4.

Integrated circuit 600 includes a region 650a1, a region 650b1 and a region 650cl.

In comparison with integrated circuit 400 of FIGS. 4A-4I, region 650al replaces region 450al of integrated circuit 400, region 650b1 replaces region 450b1 of integrated circuit 400, region 650cl replaces region 450cl of integrated circuit 400, and similar detailed description is omitted for brevity.

Region 650al is similar to integrated circuit 400 of FIGS. 4A-4I, but the set of conductors 630 of region 650al replaces set of conductors 430 of integrated circuit 400, and the set of conductors 632 of region 650al replaces set of conductors 432 of integrated circuit 400, and similar detailed description is omitted for brevity.

The set of conductors 630 includes at least one of conductor 630a, 630b, 630c, 630d, 630e or 630f.

The set of conductors 632 includes at least one of conductor 632a, 632b, 632c, 632d, 632e or 632f.

In comparison with integrated circuit 400, conductors 630a, 630b, 630c, 630d, 630e or 630f of the set of conductors 630 replaces corresponding conductors 430a, 430b, 430c, 430d, 430e or 430f of the set of conductors 430, and similar detailed description is omitted for brevity.

In comparison with integrated circuit 400, conductors 632a, 632b, 632c, 632d, 632e or 632f of the set of conductors 632 replaces corresponding conductors 432a, 432b, 432c, 432d, 432e or 432f of the set of conductors 432, and similar detailed description is omitted for brevity.

Region 650b1 identifies BM0 track usage for the set of conductors 630. Stated differently, region 650b1 identifies BM0 signals for corresponding conductors in the set of conductors 630 for the back-side of integrated circuit 600. For example, conductor 630a is configured to supply the reference supply voltage VSS, conductor 630b is the word line WL_BS, conductor 630c is the bit line BL_BS, conductor 630d is the bit line bar BLB_BS, conductor 630e is the word line WL_BS, and conductor 630f is configured to supply the reference supply voltage VSS, and in accordance with some embodiments.

Region 650cl identifies M0 track usage for the set of conductors 632. Stated differently, region 650cl identifies M0 signals for corresponding conductors in the set of conductors 632 for the front-side of integrated circuit 600. For example, conductor 632a is configured to supply the supply voltage VDD, conductor 632b is the word line WL_FS, conductor 632c is the bit line BL_FS, conductor 632d is the bit line bar BLB_FS, conductor 632e is the word line WL_FS, and conductor 632f is configured to supply the supply voltage VDD, and in accordance with some embodiments.

Other M0 track assignments are within the scope of the present disclosure.

In some embodiments, integrated circuit 600 achieves one or more of the benefits described herein.

Other configurations, arrangements on other layout levels or quantities of patterns in integrated circuit 600 are within the scope of the present disclosure.

FIG. 7 is a functional flow chart of a method 700 of manufacturing an IC device, in accordance with some embodiments. It is understood that additional operations may be performed before, during, and/or after the method 700 depicted in FIG. 7, and that some other processes may only be briefly described herein.

In some embodiments, other order of operations of method 700-900 is within the scope of the present disclosure. Method 700-900 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least method 700, 800 or 900 is not performed.

In some embodiments, method 700 is an embodiment of operation 804 of method 800. In some embodiments, the methods 700-900 are usable to manufacture or fabricate at least integrated circuit 100, 200A, 200B, 400 or 600, or an integrated circuit with similar features as at least layout design 300 or 500.

In operation 702 of method 700, a first set of transistors and a second set of transistors are fabricated on a front-side 403a of a semiconductor wafer or substrate. In some embodiments, the first set of transistors or the second set of transistors of method 700 includes one or more transistors in at least the set of active regions 402 or 404. In some embodiments, the first set of transistors or the second set of transistors of method 700 includes one or more transistors described herein.

In some embodiments, operation 702 includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1 \times 10^{12}$ atoms/cm$^3$ to $1 \times 10^{14}$ atoms/cm$^3$.

In some embodiments, the first well comprises n-type dopants. In some embodiments, the n-type dopants include phosphorus, arsenic or other suitable n-type dopants. In some embodiments, the n-type dopant concentration ranges from about $1 \times 10^{12}$ atoms/cm$^3$ to about $1 \times 10^{14}$ atoms/cm$^3$.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 702 further includes operation 702*a*. In some embodiments, operation 702*a* includes forming a first gate region of the first set of transistors. In some embodiments, the first gate region of the first set of transistors of method 700 includes the set of gates 408.

In some embodiments, operation 702 further includes operation 702*b*. In some embodiments, operation 702*b* includes forming a first insulating material on a first gate structure of the first set of transistors. In some embodiments, operation 702*b* includes forming a first insulating material over at least the first gate structure of the first gate regions of the first set of transistors. In some embodiments, the first gate structure of the first gate regions of the first set of transistors includes at least one of gate 408*b* or 408*c*. In some embodiments, the first insulating material includes the set of insulating regions 494. In some embodiments, the first insulating material includes at least one of insulating region 494*a* or 494*b*.

In some embodiments, operation 702 further includes operation 702*c*. In some embodiments, operation 702*c* includes forming a second gate region of the second set of transistors. In some embodiments, the second gate regions of the second set of transistors of method 700 include the set of gates 406.

In some embodiments, the first and second gate region is between the drain region and the source region. In some embodiments, the first and second gate region is over the first well and the substrate. In some embodiments, fabricating the first and second gate regions of operations 702*a* and 702*c* include performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the first and second gate regions includes performing one or more deposition processes to form one or more conductive material layers. In some embodiments, fabricating the first and second gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the first and second gate regions include a metal, such as Al, Cu, W, Ti, Ta, TiN, TaN, NiSi, CoSi, other suitable conductive materials, or combinations thereof.

In some embodiments, forming the first insulating material on the first gate structure of the first set of transistors of operation 702*b* includes performing one or more deposition processes to form one or more dielectric material layers and/or insulating material layers. In some embodiments, the one or more deposition processes to form one or more dielectric material layers and/or insulating material layers includes CVD, a PECVD, ALD, or other process suitable for depositing one or more material layers. In some embodiments, forming the first insulating material on the first gate structure of the first set of transistors includes performing one or more deposition processes to form one or more insulating material layers. In some embodiments, the first insulating material is a dielectric material. In some embodiments, the dielectric material includes silicon dioxide, silicon oxy-nitride, or the like.

In some embodiments, operation 702*a*, 702*b* and 702*c* are replaced by forming the first gate regions of the first set of transistors and the second gate regions of the second set of transistors, removing a portion of the first gate regions of the first set of transistors and the second gate regions of the second set of transistors, and forming the first insulating material between the first gate structure of the first set of transistors and the second gate structure of the second set of transistors. In some embodiments, the gate removal process is a POLY cut process that includes one or more etching processes. In some embodiments, the gate removal process includes one or more etching processes suitable to remove a portion of the gate structure. In some embodiments, a mask is used to specify portions of the gate structure that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like.

In some embodiments, operation 702 further includes operation 702*d*. In some embodiments, operation 702*d* includes depositing a first conductive material on at least one of a first level, a second level or a third level thereby forming at least one of a corresponding first set of contacts, a second set of contacts or a third set of contacts.

In some embodiments, the first set of contacts, the second set of contacts and the third set of contacts are part of the first set of transistors and the second set of transistors.

In some embodiments, the first set of contacts includes the set of contacts 410.

In some embodiments, the second set of contacts includes the set of contacts 412.

In some embodiments, the third set of contacts includes the set of contacts 414.

In operation 704 of method 700, a first set of vias are formed on the front-side 403*a* of the a wafer or substrate on a VD level or a VG level (e.g., VD or VG). In some embodiments, the first set of vias of method 700 includes one or more portions at least the set of vias 420 or 424.

In some embodiments, operation 704 includes forming a first set of self-aligned contacts (SACs) in the insulating layer over the front-side 403*a* of the wafer. In some embodiments, the first set of vias is electrically coupled to at least the first set of transistors or the second set of transistors.

In operation 706 of method 700, a second conductive material is deposited on the front-side 403*a* of the substrate on a fourth level thereby forming a fourth set of contacts on the front-side 403*a* of the wafer or substrate.

In some embodiments, operation 706 includes at least depositing a first set of conductive regions over the front-side 403*a* of the integrated circuit. In some embodiments, the fourth set of contacts of method 700 includes one or more portions of at least the set of contacts 416.

In operation 708 of method 700, a third conductive material is deposited on the front-side 403*a* of the substrate on a first metal level thereby forming a first set of conductors on the front-side 403*a* of the wafer or substrate on a first metal level (e.g., M0).

In some embodiments, operation 708 includes at least depositing a second set of conductive regions over the front-side 403*a* of the integrated circuit. In some embodiments, the first set of conductors of method 700 includes one or more portions of at least the set of conductors 430 or 632.

In operation 710 of method 700, thinning is performed on the back-side 403*b* of the wafer or substrate. In some embodiments, operation 710 includes a thinning process performed on the back-side 403*b* of the semiconductor wafer or substrate. In some embodiments, the thinning process includes a grinding operation and a polishing operation (such as chemical mechanical polishing (CMP)) or other suitable processes. In some embodiments, after the thinning process, a wet etching operation is performed to remove defects formed on the back-side 403*b* of the semiconductor wafer or substrate.

In operation 712 of method 700, a second set of vias are formed on the back-side 403*b* of the thinned wafer or substrate on a BVD level or a BVG level (e.g., BVD or BVG). In some embodiments, the second set of vias of method 700 includes one or more portions at least the set of vias 422 or 426.

In some embodiments, operation 712 includes forming a second set of self-aligned contacts (SACs) in the insulating layer over the back-side 403*b* of the wafer. In some embodiments, the second set of vias is electrically coupled to at least the first set of transistors or the second set of transistors.

In operation 714 of method 700, a fourth conductive material is deposited on the back-side 403*b* of the substrate on a second metal level thereby forming a second set of conductors on the back-side 403*b* of the wafer or substrate on a second metal level (e.g., BM0).

In some embodiments, operation 714 includes at least depositing a third set of conductive regions over the back-side 403*b* of the integrated circuit. In some embodiments, the second set of conductors of method 700 includes one or more portions of at least the set of conductors 432 or 630.

In some embodiments, one or more of operations 702, 704, 706, 710, 712 or 714 of method 700 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 11:
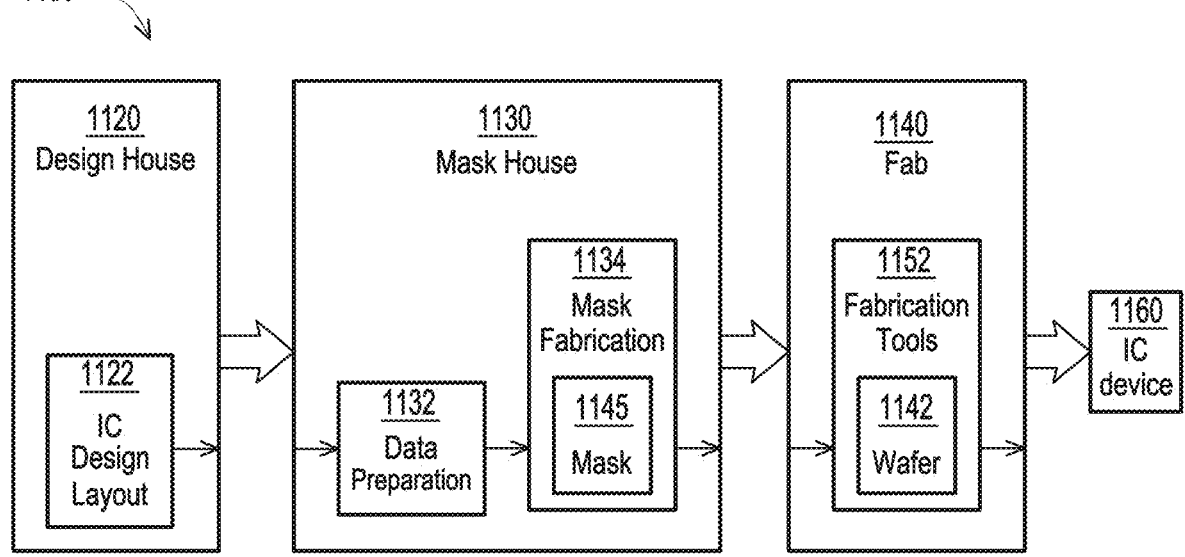
FIG. 11 is a block diagram of an IC manufacturing system, and an IC manufacturing flow associated therewith, in accordance with at least one embodiment of the present disclosure.

In some embodiments, at least one or more operations of method 700 is performed by system 1100 of FIG. 11. In some embodiments, at least one method(s), such as method 700 discussed above, is performed in whole or in part by at least one manufacturing system, including system 1100. One or more of the operations of method 700 is performed by IC fab 1140 (FIG. 11) to fabricate IC device 1160. In some embodiments, one or more of the operations of method 700 is performed by fabrication tools 1152 to fabricate wafer 1142.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 702*d*, 706, 708 or 714, the conductive material is planarized to provide a level surface for subsequent steps.

In some embodiments, one or more of the operations of method 700, 800 or 900 is not performed.

One or more of the operations of methods 800-900 is performed by a processing device configured to execute instructions for manufacturing an integrated circuit, such as at least integrated circuit 100, 200A, 200B, 400 or 600. In some embodiments, one or more operations of methods 800-900 is performed using a same processing device as that used in a different one or more operations of methods 800-900. In some embodiments, a different processing device is used to perform one or more operations of methods 800-900 from that used to perform a different one or more operations of methods 800-900. In some embodiments, other order of operations of method 700, 800 or 900 is within the scope of the present disclosure. Method 700, 800 or 900 includes exemplary operations, but the operations are not necessarily performed in the order shown. Operations in method 700, 800 or 900 may be added, replaced, changed order, and/or eliminated as appropriate, in accordance with the spirit and scope of disclosed embodiments.

Figure 8:
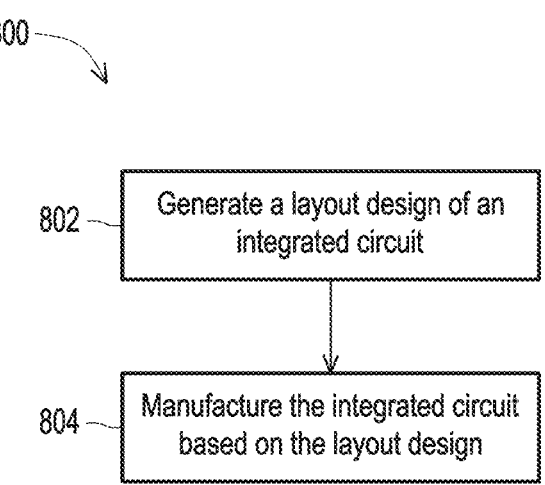
FIG. 8 is a flow chart of a method of manufacturing an integrated circuit, in accordance with some embodiments.

FIG. 8 is a flowchart of a method 800 of forming or manufacturing an integrated circuit in accordance with some embodiments. It is understood that additional operations may be performed before, during, and/or after the method 800 depicted in FIG. 8, and that some other operations may only be briefly described herein. In some embodiments, the method 800 is usable to form integrated circuits, such as at least integrated circuit 100, 200A, 200B, 400 or 600. In some embodiments, the method 800 is usable to form integrated circuits having similar features and similar structural relationships as one or more of layout design 300 or 500.

In operation 802 of method 800, a layout design of an integrated circuit is generated. Operation 802 is performed by a processing device (e.g., processor 1002 (FIG. 10)) configured to execute instructions for generating a layout design. In some embodiments, the layout design of method 800 includes one or more patterns of at least layout design 300 or 500, or one or more features similar to at least integrated circuit 100, 200A, 200B, 400 or 600. In some embodiments, the layout design of the present application is in a graphic database system (GDSII) file format. In some embodiments, operation 802 corresponds to method 900 of FIG. 9.

In operation 804 of method 800, the integrated circuit is manufactured based on the layout design. In some embodiments, operation 804 of method 800 comprises manufacturing at least one mask based on the layout design, and manufacturing the integrated circuit based on the at least one mask. In some embodiments, operation 804 corresponds to method 700 of FIG. 7.

Figure 9:
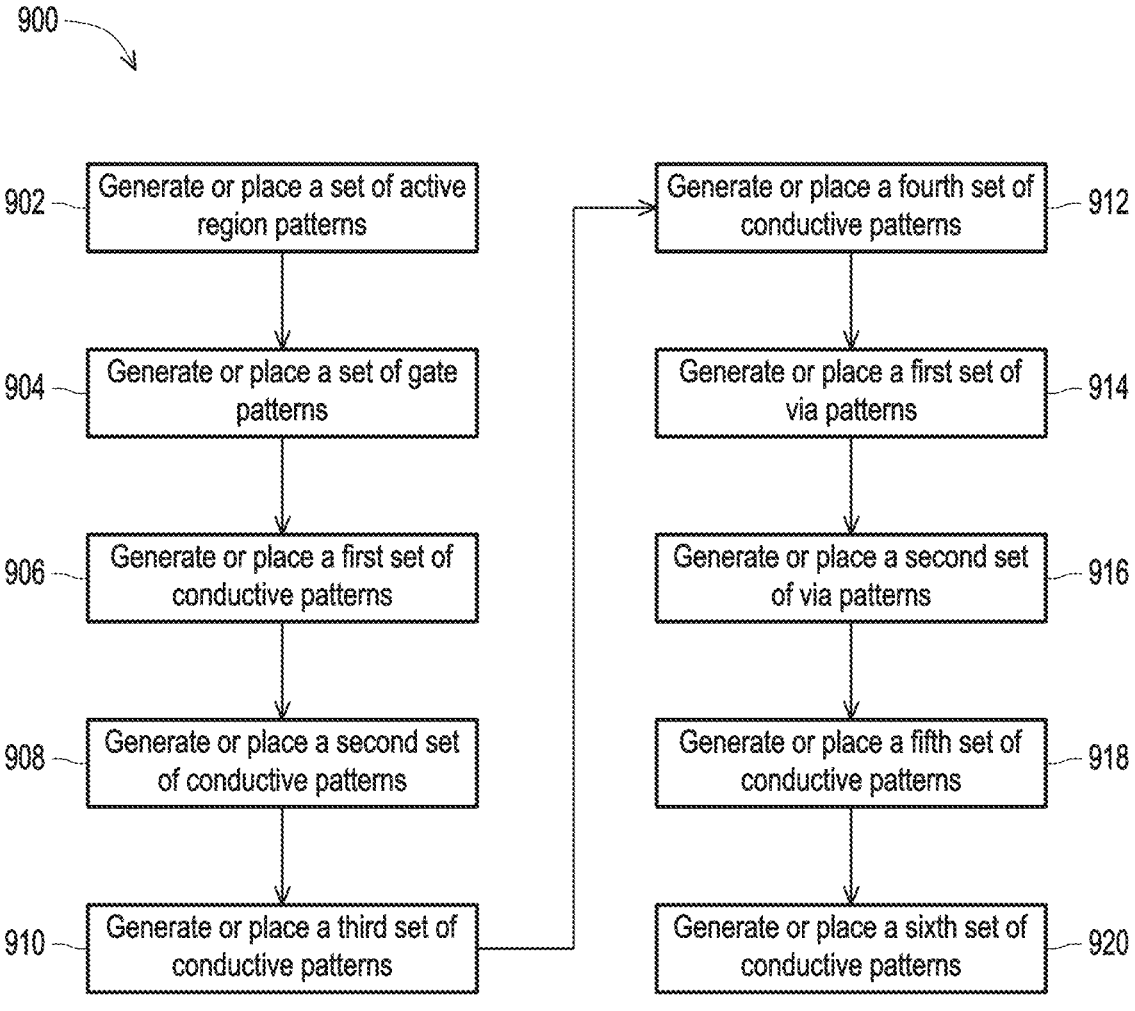
FIG. 9 is a flowchart of a method of generating a layout design of an integrated circuit, in accordance with some embodiments.

FIG. 9 is a flowchart of a method 900 of generating a layout design of an integrated circuit, in accordance with some embodiments. It is understood that additional operations may be performed before, during, and/or after the method 900 depicted in FIG. 9, and that some other processes may only be briefly described herein. In some embodiments, method 900 is an embodiment of operation 802 of method 800. In some embodiments, method 900 is usable to generate one or more layout patterns of at least layout design 300 or 500, or one or more features similar to at least integrated circuit 100, 200A, 200B, 400 or 600.

In some embodiments, method 900 is usable to generate one or more layout patterns having structural relationships including alignment, lengths and widths, as well as configurations and layers of at least layout design 300 or 500, or one or more features similar to at least integrated circuit 100, 200A, 200B, 400 or 600, and similar detailed description will not be described in FIG. 9, for brevity.

In operation 902 of method 900, a set of active region patterns is generated or placed on the layout design. In some embodiments, the set of active region patterns of method 900 includes at least portions of one or more patterns of the set of active region patterns 302 or 304. In some embodiments, the set of active region patterns of method 900 includes one or more regions similar to the set of active regions 402 or 404. In some embodiments, the set of active region patterns of method 900 includes one or more patterns or similar patterns in the OD layer.

In operation 904 of method 900, a set of gate patterns is generated or placed on the layout design. In some embodiments, the set of gate patterns of method 900 includes at least portions of one or more patterns of the set of gate patterns 306 or 308. In some embodiments, the set of active gate patterns of method 900 includes one or more regions similar to the set of gates 406 or 408. In some embodiments, the set of gate patterns of method 900 includes at least portions of one or more patterns of the set of insulating patterns 394. In some embodiments, the set of gate patterns of method 900 includes one or more regions similar to the set of insulating regions 494. In some embodiments, the set of gate patterns of method 900 includes one or more patterns or similar patterns in the POLY layer.

In operation 906 of method 900, a first set of conductive patterns is generated or placed on the layout design. In some embodiments, the first set of conductive patterns of method 900 includes at least portions of one or more patterns of the set of contact patterns 310. In some embodiments, the first set of conductive patterns of method 900 includes one or more patterns similar to the set of contacts 410. In some embodiments, the first set of conductive patterns of method 900 includes one or more patterns or similar patterns in the MD layer.

In operation 908 of method 900, a second set of conductive patterns is generated or placed on the layout design. In some embodiments, the second set of conductive patterns of method 900 includes at least portions of one or more patterns of the set of contact patterns 312. In some embodiments, the second set of conductive patterns of method 900 includes one or more patterns similar to the set of contacts 412. In some embodiments, the second set of conductive patterns of method 900 includes one or more patterns or similar patterns in the BMD layer.

In operation 910 of method 900, a third set of conductive patterns is generated or placed on the layout design. In some embodiments, the third set of conductive patterns of method 900 includes at least portions of one or more patterns of the set of contact patterns 314. In some embodiments, the third set of conductive patterns of method 900 includes one or more patterns similar to the set of contacts 414. In some embodiments, the third set of conductive patterns of method 900 includes one or more patterns or similar patterns in the MDLI layer.

In operation 912 of method 900, a fourth set of conductive patterns is generated or placed on the layout design. In some embodiments, the fourth set of conductive patterns of method 900 includes at least portions of one or more patterns of the set of contact patterns 316. In some embodiments, the fourth set of conductive patterns of method 900 includes one or more patterns similar to the set of contacts 416. In some embodiments, the fourth set of conductive patterns of method 900 includes one or more patterns or similar patterns in the BCT layer.

In operation 914 of method 900, a first set of via patterns is generated or placed on the layout design. In some embodiments, the first set of via patterns of method 900 includes at least portions of one or more patterns of the set of via patterns 320 or 324. In some embodiments, the first set of via patterns of method 900 includes one or more via patterns similar to at least the set of vias 420 or 424. In some embodiments, the first set of via patterns of method 900 includes one or more patterns or similar vias in the VG or VD layer.

In operation 916 of method 900, a second set of via patterns is generated or placed on the layout design. In some embodiments, the second set of via patterns of method 900 includes at least portions of one or more patterns of the set of via patterns 322 or 326. In some embodiments, the second set of via patterns of method 900 includes one or more via patterns similar to at least the set of vias 422 or 426. In some embodiments, the second set of via patterns of method 900 includes one or more patterns or similar vias in the BVG or BVD layer.

In operation 918 of method 900, a fifth set of conductive patterns is generated or placed on the layout design. In some embodiments, the fifth set of conductive patterns of method 900 includes at least portions of one or more patterns of at least the set of conductive patterns 330 or 532. In some embodiments, the fifth set of conductive patterns of method 900 includes one or more conductive patterns similar to at least the set of conductors 430 or 632. In some embodiments, the fifth set of conductive patterns of method 900 includes one or more patterns or similar conductors in the M0 layer.

In operation 920 of method 900, a sixth set of conductive patterns is generated or placed on the layout design. In some embodiments, the sixth set of conductive patterns of method 900 includes at least portions of one or more patterns of at least the set of conductive patterns 332 or 530. In some embodiments, the sixth set of conductive patterns of method 900 includes one or more conductive patterns similar to at least the set of conductors 432 or 630. In some embodiments, the sixth set of conductive patterns of method 900 includes one or more patterns or similar conductors in the BM0 layer.

Figure 10:
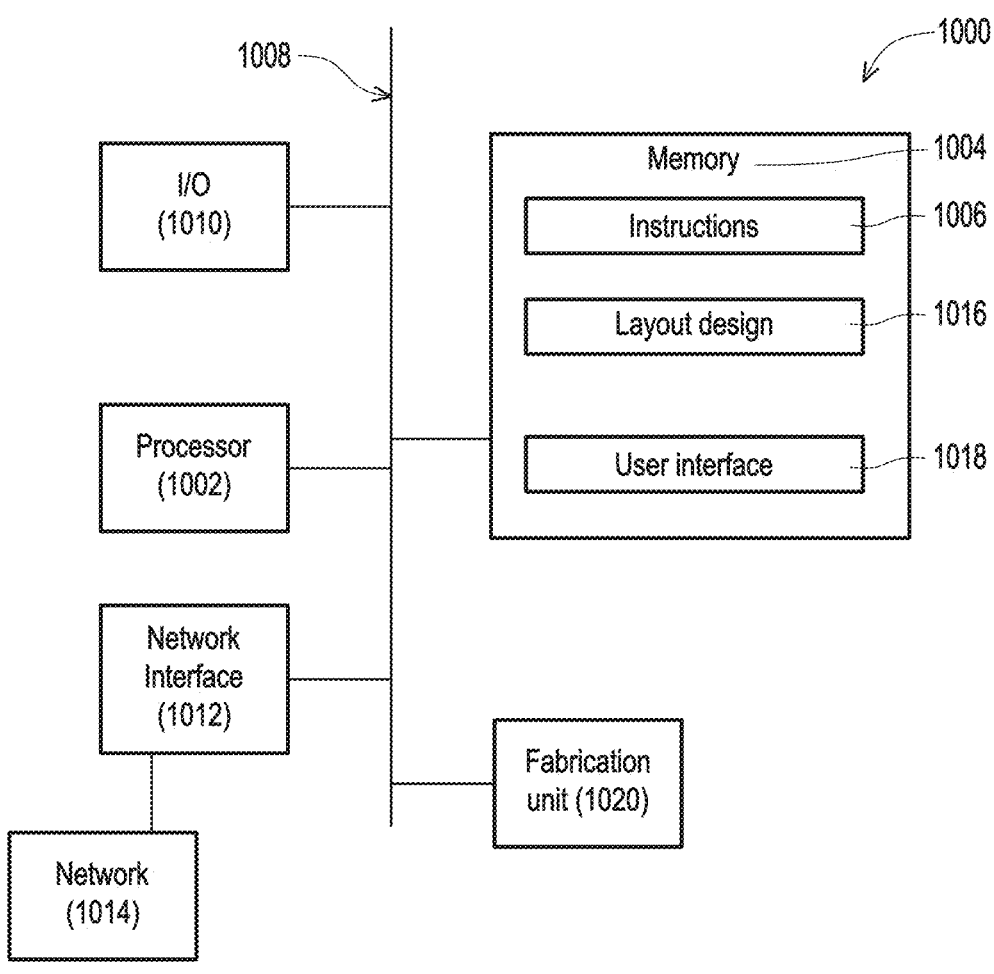
FIG. 10 is a schematic view of a system for designing an IC layout design and manufacturing an IC circuit, in accordance with some embodiments.

FIG. 10 is a schematic view of a system 1000 for designing an IC layout design and manufacturing an IC circuit in accordance with some embodiments.

In some embodiments, system 1000 generates or places one or more IC layout designs described herein. System 1000 includes a hardware processor 1002 and a non-transitory, computer readable storage medium 1004 (e.g., memory 1004) encoded with, i.e., storing, the computer program code 1006, i.e., a set of executable instructions 1006. Computer readable storage medium 1004 is configured for interfacing with manufacturing machines for producing the integrated circuit. The processor 1002 is electrically coupled to the computer readable storage medium 1004 via a bus 1008. The processor 1002 is also electrically coupled to an I/O interface 1010 by bus 1008. A network interface 1012 is also electrically connected to the processor 1002 via bus 1008. Network interface 1012 is connected to a network 1014, so that processor 1002 and computer readable storage medium 1004 are capable of connecting to external elements via network 1014. The processor 1002 is configured to execute the computer program code 1006 encoded in the computer readable storage medium 1004 in order to cause system 1000 to be usable for performing a portion or all of the operations as described in method 800-900.

In some embodiments, the processor 1002 is a central processing unit (CPU), a multi-processor, a distributed processing system, an application specific integrated circuit (ASIC), and/or a suitable processing unit.

In some embodiments, the computer readable storage medium 1004 is an electronic, magnetic, optical, electromagnetic, infrared, and/or a semiconductor system (or apparatus or device). For example, the computer readable storage medium 1004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1004 includes a compact disk-read only memory (CD-ROM), a compact disk-read/write (CD-R/W), and/or a digital video disc (DVD).

In some embodiments, the storage medium 1004 stores the computer program code 1006 configured to cause system 1000 to perform method 800-900. In some embodiments, the storage medium 1004 also stores information needed for performing method 800-900 as well as information generated during performing method 800-900, such as layout design 1016, user interface 1018 and fabrication unit 1020, and/or a set of executable instructions to perform the operation of method 800-900. In some embodiments, layout design 1016 comprises one or more of layout patterns of at least layout design 300 or 500, or features similar to at least integrated circuit 100, 200A, 200B, 400 or 600.

In some embodiments, the storage medium 1004 stores instructions (e.g., computer program code 1006) for interfacing with manufacturing machines. The instructions (e.g., computer program code 1006) enable processor 1002 to generate manufacturing instructions readable by the manufacturing machines to effectively implement method 800-900 during a manufacturing process.

System 1000 includes I/O interface 1010. I/O interface 1010 is coupled to external circuitry. In some embodiments, I/O interface 1010 includes a keyboard, keypad, mouse, trackball, trackpad, and/or cursor direction keys for communicating information and commands to processor 1002.

System 1000 also includes network interface 1012 coupled to the processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interface such as ETHERNET, USB, or IEEE-2094. In some embodiments, method 800-900 is implemented in two or more systems 1000, and information such as layout design, and user interface are exchanged between different systems 1000 by network 1014.

System 1000 is configured to receive information related to a layout design through I/O interface 1010 or network interface 1012. The information is transferred to processor 1002 by bus 1008 to determine a layout design for producing at least integrated circuit 100, 200A, 200B, 400 or 600. The layout design is then stored in computer readable medium 1004 as layout design 1016. System 1000 is configured to receive information related to a user interface through I/O interface 1010 or network interface 1012. The information is stored in computer readable medium 1004 as user interface 1018. System 1000 is configured to receive information related to a fabrication unit 1020 through I/O interface 1010 or network interface 1012. The information is stored in computer readable medium 1004 as fabrication unit 1020. In some embodiments, the fabrication unit 1020 includes fabrication information utilized by system 1000. In some embodiments, the fabrication unit 1020 corresponds to mask fabrication 1134 of FIG. 11.

In some embodiments, method 800-900 is implemented as a standalone software application for execution by a processor. In some embodiments, method 800-900 is implemented as a software application that is a part of an additional software application. In some embodiments, method 800-900 is implemented as a plug-in to a software application. In some embodiments, method 800-900 is implemented as a software application that is a portion of an EDA tool. In some embodiments, method 800-900 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 800-900 is implemented by a manufacturing device to manufacture an integrated circuit using a set of masks manufactured based on one or more layout designs generated by system 1000. In some embodiments, system 1000 is a manufacturing device configured to manufacture an integrated circuit using a set of masks manufactured based on one or more layout designs of the present disclosure. In some embodiments, system 1000 of FIG. 10 generates layout designs of an integrated circuit that are smaller than other approaches. In some embodiments, system 1000 of FIG. 10 generates layout designs of integrated circuit structure that occupy less area and provide better routing resources than other approaches.

FIG. 11 is a block diagram of an integrated circuit (IC) manufacturing system 1100, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 (hereinafter "system 1100") includes entities, such as a design house 1120, a mask house 1130, and an IC manufacturer/fabricator ("fab") 1140, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1120, mask house 1130, and IC fab 1140 is owned by a single larger company. In some embodiments, one or more of design house 1120, mask house 1130, and IC fab 1140 coexist in a common facility and use common resources.

Design house (or design team) 1120 generates an IC design layout 1122. IC design layout 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout 1122 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout 1122. The design procedure includes one or more of logic design, physical design or place and route. IC design layout 1122 is presented in one or more data files having information of the geometrical patterns. For example, IC design layout 1122 can be expressed in a GDSII file format or DFII file format.

Mask house 1130 includes data preparation 1132 and mask fabrication 1134. Mask house 1130 uses IC design layout 1122 to manufacture one or more masks 1145 to be used for fabricating the various layers of IC device 1160 according to IC design layout 1122. Mask house 1130 performs mask data preparation 1132, where IC design layout 1122 is translated into a representative data file (RDF). Mask data preparation 1132 provides the RDF to mask fabrication 1134. Mask fabrication 1134 includes a mask writer. A mask writer converts the RDF to an image on a substrate, such as a mask (reticle) 1145 or a semiconductor wafer 1142. The IC design layout 1122 is manipulated by mask data preparation 1132 to comply with particular characteristics of the mask writer and/or requirements of IC fab

1140. In FIG. 11, mask data preparation 1132 and mask fabrication 1134 are illustrated as separate elements. In some embodiments, mask data preparation 1132 and mask fabrication 1134 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1134, which may undo part of the modifications performed by OPC in order to meet mask creation rules.

In some embodiments, mask data preparation 1132 includes lithography process checking (LPC) that simulates processing that will be implemented by IC fab 1140 to fabricate IC device 1160. LPC simulates this processing based on IC design layout 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1122.

It should be understood that the above description of mask data preparation 1132 has been simplified for the purposes of clarity. In some embodiments, data preparation 1132 includes additional features such as a logic operation (LOP) to modify the IC design layout according to manufacturing rules. Additionally, the processes applied to IC design layout 1122 during data preparation 1132 may be executed in a variety of different orders.

After mask data preparation 1132 and during mask fabrication 1134, a mask 1145 or a group of masks 1145 are fabricated based on the modified IC design layout 1122. In some embodiments, mask fabrication 1134 includes performing one or more lithographic exposures based on IC design layout 1122. In some embodiments, an electron-beam (e-beam) or a mechanism of multiple e-beams is used to form a pattern on a mask (photomask or reticle) 1145 based on the modified IC design layout 1122. The mask 1145 can be formed in various technologies. In some embodiments, the mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1145 includes a transparent substrate (e.g., fused quartz) and an opaque material (e.g., chromium) coated in the opaque regions of the binary mask. In another example, the mask 1145 is formed using a phase shift technology. In the phase shift mask (PSM) version of mask 1145, various features in the pattern formed on the mask are configured to have proper phase difference to enhance the resolution and imaging quality. In various examples, the phase shift mask can be attenuated PSM or alternating PSM. The mask(s) generated by mask fabrication 1134 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1140 is an IC fabrication entity that includes one or more manufacturing facilities for the fabrication of a variety of different IC products. In some embodiments, IC Fab 1140 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1140 includes wafer fabrication tools 1152 (hereinafter "fabrication tools 1152") configured to execute various manufacturing operations on semiconductor wafer 1142 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1140 uses mask(s) 1145 fabricated by mask house 1130 to fabricate IC device 1160. Thus, IC fab 1140 at least indirectly uses IC design layout 1122 to fabricate IC device 1160. In some embodiments, a semiconductor wafer 1142 is fabricated by IC fab 1140 using mask(s) 1145 to form IC device 1160. In some embodiments, the IC fabrication includes performing one or more lithographic exposures based at least indirectly on IC design 1122. Semiconductor wafer 1142 includes a silicon substrate or other proper substrate having material layers formed thereon. Semiconductor wafer 1142 further includes one or more of various doped regions, dielectric features, multilevel interconnects, and the like (formed at subsequent manufacturing steps).

System 1100 is shown as having design house 1120, mask house 1130 or IC fab 1140 as separate components or entities. However, it is understood that one or more of design house 1120, mask house 1130 or IC fab 1140 are part of the same component or entity.

One aspect of this description relates to a dual-port memory cell. In some embodiments, the dual-port memory cell includes a first pass-gate transistor of a first type, the first pass-gate transistor including a first gate on a first level. In some embodiments, the dual-port memory cell further includes a second pass-gate transistor of a second type different from the first type, and the second pass-gate transistor including a second gate on a second level below the first level. In some embodiments, the dual-port memory cell further includes a third pass-gate transistor of the first type, the third pass-gate transistor including a third gate on the first level. In some embodiments, the dual-port memory cell further includes a fourth pass-gate transistor of the second type, the fourth pass-gate transistor including a fourth gate on the second level. In some embodiments, the dual-port memory cell further includes a first word line extending in a first direction, being on a first metal layer above a front-side of a substrate, and being coupled to the first pass-gate transistor and the third pass-gate transistor. In some embodiments, the dual-port memory cell further includes a second word line extending in the first direction, being on a second metal layer below a back-side of the substrate opposite from the front-side of the substrate, and the second word line being coupled to the second pass-gate transistor and the fourth pass-gate transistor In some embodiments, the first pass-gate transistor and the third pass-gate transistor correspond to a first port of the dual-port memory cell. In some embodiments, the second pass-gate transistor and the fourth pass-gate transistor correspond to a second port of the dual-port memory cell.

Another aspect of this description relates to a dual-port memory cell. In some embodiments, the dual-port memory cell includes a first transistor stack on a substrate. In some embodiments, the first transistor stack includes a first pass-gate transistor of a first type, and being on a first level, and a second pass-gate transistor of a second type different from the first type, and the second pass-gate transistor being on a second level different from the first level. In some embodiments, the dual-port memory cell further includes a second transistor stack on the substrate. In some embodiments, the second transistor stack includes a third pass-gate transistor of the first type, and being on the first level, and a fourth pass-gate transistor of the second type, and being on the second level. In some embodiments, the dual-port memory cell further includes a first bit line extending in a first direction, being configured to supply a first bit line signal to the first pass-gate transistor, being coupled to the first pass-gate transistor, and being on a first metal layer above a front-side of the substrate. In some embodiments, the dual-port memory cell further includes a second bit line extending in the first direction, being configured to supply a second bit line signal to the second pass-gate transistor, being coupled to the second pass-gate transistor, and being on a second metal layer below a back-side of the substrate opposite from the front-side of the substrate. In some embodiments, the first pass-gate transistor and the third pass-gate transistor correspond to a first port of the dual-port memory cell. In some embodiments, the second pass-gate transistor and the fourth pass-gate transistor correspond to a second port of the dual-port memory cell.

Still another aspect of this description relates to a method of fabricating a dual-port memory cell. In some embodiments, the method includes fabricating a first set of transistors and a second set of transistors in a front-side of a substrate, the first set of transistors being stacked above the second set of transistors, the first set of transistors including a first pass-gate transistor and a second pass-gate transistor that correspond to a first port of the dual-port memory cell, the second set of transistors including a third pass-gate transistor and a fourth pass-gate transistor that correspond to a second port of the dual-port memory cell. In some embodiments, the method further includes fabricating a first set of vias on the front-side of the substrate, the first set of vias being electrically coupled to at least the first set of transistors. In some embodiments, the method further includes depositing a first conductive material on the front-side of the substrate on a first metal level thereby forming a first set of conductors, the first set of conductors being electrically coupled to at least the first set of transistors by the first set of vias, the first set of conductors including at least a first word line of the first port, a first bit line of the first port or a first bit line bar of the first port. In some embodiments, the method further includes performing thinning on a back-side of the substrate opposite from the front-side. In some embodiments, the method further includes fabricating a second set of vias on the back-side of the thinned substrate, the second set of vias being electrically coupled to at least the second set of transistors. In some embodiments, the method further includes depositing a second conductive material on the back-side of the thinned substrate on a second metal level thereby forming a second set of conductors, the second set of conductors being electrically coupled to at least the second set of transistors by the second set of vias, the second set of conductors including at least a second word line of the second port, a second bit line of the second port or a second bit line bar of the second port.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dual-port memory cell, comprising:
a first pass-gate transistor of a first type, the first pass-gate transistor including a first gate on a first level;
a second pass-gate transistor of a second type different from the first type, and the second pass-gate transistor including a second gate on a second level below the first level;
a third pass-gate transistor of the first type, the third pass-gate transistor including a third gate on the first level;
a fourth pass-gate transistor of the second type, the fourth pass-gate transistor including a fourth gate on the second level;
a first word line extending in a first direction, being on a first metal layer above a front-side of a substrate, and being coupled to the first pass-gate transistor and the third pass-gate transistor; and
a second word line extending in the first direction, being on a second metal layer below a back-side of the substrate opposite from the front-side of the substrate, and the second word line being coupled to the second pass-gate transistor and the fourth pass-gate transistor,
wherein the first pass-gate transistor and the third pass-gate transistor correspond to a first port of the dual-port memory cell, and
the second pass-gate transistor and the fourth pass-gate transistor correspond to a second port of the dual-port memory cell.

2. The dual-port memory cell of claim 1, further comprising:
a first gate isolation layer between the first gate and the second gate; and a second gate isolation layer between the third gate and the fourth gate.

3. The dual-port memory cell of claim 1, further comprising:
a first inverter coupled to the first pass-gate transistor, the second pass-gate transistor, the third pass-gate transistor and the fourth pass-gate transistor; and
a second inverter coupled to the first pass-gate transistor, the second pass-gate transistor, the third pass-gate transistor and the fourth pass-gate transistor.

4. The dual-port memory cell of claim 3, wherein
the first word line is configured to supply a first word line signal of the first port, and the first word line comprises:
a first conductor extending in the first direction, being coupled to the first pass-gate transistor, and being on the first metal layer; and
a second conductor extending in the first direction, being coupled to the third pass-gate transistor, being on the first metal layer, and being separated from the first conductor in a second direction different from the first direction; and
the second word line is configured to supply a second word line signal of the second port, and the second word line comprises:
a third conductor extending in the first direction, being coupled to the second pass-gate transistor, and being on the second metal layer; and
a fourth conductor extending in the first direction, being coupled to the fourth pass-gate transistor, being on the second metal layer, and being separated from the third conductor in the second direction.

5. The dual-port memory cell of claim 4, wherein
the first gate extends in the second direction and is overlapped by the first conductor;
the second gate extends in the second direction, and overlaps the second conductor;
the third gate extends in the second direction, is separated from the first gate in the second direction, and is overlapped by the third conductor; and
the fourth gate extends in the second direction, is separated from the second gate in the second direction, and overlaps the fourth conductor.

6. The dual-port memory cell of claim 5, further comprising:
a first via electrically coupling the first conductor and the first gate together, the first via being between the first conductor and the first gate;
a second via electrically coupling the third conductor and the second gate together, the second via being between the third conductor and the second gate;
a third via electrically coupling the second conductor and the third gate together, the third via being between the second conductor and the third gate; and
a fourth via electrically coupling the fourth conductor and the fourth gate together, the fourth via being between the fourth conductor and the fourth gate.

7. The dual-port memory cell of claim 3, further comprising:
a first bit line extending in the first direction, being configured to receive a first bit line signal of the first port, being on the first metal layer, and being coupled to the first pass-gate transistor;
a second bit line extending in the first direction, being configured to receive a second bit line signal of the second port, being on the second metal layer, and being coupled to the second pass-gate transistor;

a first bit line bar extending in the first direction, being configured to receive a first bit line bar signal of the first port, being on the first metal layer, and being coupled to the third pass-gate transistor; and a second bit line bar extending in the first direction, being configured to receive a second bit line bar signal of the second port, being on the second metal layer, and being coupled to the fourth pass-gate transistor.

8. The dual-port memory cell of claim 7, further comprising:

a first contact extending in a second direction different from the first direction, the first contact being on a third level, and being electrically coupled to a source/drain of the first pass-gate transistor;

a second contact extending in the second direction, being on a fourth level different from the third level, the second contact being electrically coupled to a source/drain of the second pass-gate transistor;

a third contact extending in the second direction, being on the third level, and being electrically coupled to a source/drain of the third pass-gate transistor; and a fourth contact extending in the second direction, being on the fourth level, and being electrically coupled to a source/drain of the fourth pass-gate transistor.

9. The dual-port memory cell of claim 8, further comprising:

a first via electrically coupling the first bit line and the first contact together, the first via being between the first bit line and the first contact;

a second via electrically coupling the second bit line and the second contact together, the second via being between the second bit line and the second contact;

a third via electrically coupling the first bit line bar and the third contact together, the third via being between the first bit line bar and the third contact; and a fourth via electrically coupling the second bit line bar and the fourth contact together, the fourth via being between the second bit line bar and the fourth contact.

10. A dual-port memory cell comprising:

a first transistor stack on a substrate, the first transistor stack comprising:

a first pass-gate transistor of a first type, and being on a first level; and a second pass-gate transistor of a second type different from the first type, and the second pass-gate transistor being on a second level different from the first level;

a second transistor stack on the substrate, the second transistor stack comprising:

a third pass-gate transistor of the first type, and being on the first level; and a fourth pass-gate transistor of the second type, and being on the second level; and a first bit line extending in a first direction, being configured to supply a first bit line signal to the first pass-gate transistor, being coupled to the first pass-gate transistor, and being on a first metal layer above a front-side of the substrate; and a second bit line extending in the first direction, being configured to supply a second bit line signal to the second pass-gate transistor, being coupled to the second pass-gate transistor, and being on a second metal layer below a back-side of the substrate opposite from the front-side of the substrate, wherein the first pass-gate transistor and the third pass-gate transistor correspond to a first port of the dual-port memory cell, and the second pass-gate transistor and the fourth pass-gate transistor correspond to a second port of the dual-port memory cell.

11. The dual-port memory cell of claim 10, further comprising:

a first bit line bar extending in the first direction, being configured to receive a first bit line bar signal of the first port, being on the first metal layer, and being coupled to the third pass-gate transistor; and a second bit line bar extending in the first direction, being configured to receive a second bit line bar signal of the second port, being on the second metal layer, and being coupled to the fourth pass-gate transistor.

12. The dual-port memory cell of claim 11, wherein the first bit line comprises:

a first conductor extending in the first direction, being coupled to the first pass-gate transistor, and being on the first metal layer;

the second bit line comprises:

a second conductor extending in the first direction, being coupled to the second pass-gate transistor, and being on the second metal layer;

the first bit line bar comprises:

a third conductor extending in the first direction, being coupled to the third pass-gate transistor, being on the first metal layer, and being separated from the first conductor in a second direction different from the first direction; and the second bit line bar comprises:

a fourth conductor extending in the first direction, being coupled to the fourth pass-gate transistor, and being on the second metal layer, and being separated from the second conductor in the second direction.

13. The dual-port memory cell of claim 12, further comprising:

a third transistor stack on the substrate, the third transistor stack comprising:

a first transistor of the first type, and being on the first level; and a second transistor of the second type, and being on the second level; and a fourth transistor stack on the substrate, the fourth transistor stack comprising:

a third transistor of the first type, and being on the first level; and a fourth transistor of the second type, and being on the second level.

14. The dual-port memory cell of claim 13, further comprising:

a first contact extending in a second direction different from the first direction, the first contact being on a third level, and being electrically coupled to a source/drain of the first pass-gate transistor, a source/drain of the second pass-gate transistor, a source/drain of the first transistor and a source/drain of the second transistor; and a second contact extending in the second direction, being on the third level, and being electrically coupled to a source/drain of the third pass-gate transistor, a source/drain of the fourth pass-gate transistor, a source/drain of the third transistor and a source/drain of the fourth transistor.

15. The dual-port memory cell of claim 14, wherein the first transistor comprises:

a first gate extending in the second direction, and being on a fourth level;

the second transistor comprises:

a second gate extending in the second direction, being below the first gate, and being on a fifth level different from the fourth level;

the third transistor comprises:

a third gate extending in the second direction and being separated from the first gate in the first direction and the second direction, the third gate being on the fourth level; and the fourth transistor comprises:

a fourth gate extending in the second direction, being separated from the second gate in the first direction and the second direction, being below the third gate, and being on the fifth level.

16. The dual-port memory cell of claim 15, further comprising:

a third contact extending in the first direction, being on a sixth level different from the fourth level and the fifth level, overlapping the first gate, the second gate and second contact and being electrically coupled to the first gate and the second contact; and a fourth contact extending in the first direction, being separated from the third contact in the second direction, being on the sixth level, overlapping the third gate, the fourth gate and the first contact and being electrically coupled to the third gate and the first contact.

17. The dual-port memory cell of claim 16, further comprising:

a first word line extending in the first direction, being on the first metal layer, and being coupled to the first pass-gate transistor and the third pass-gate transistor; and a second word line extending in the first direction, being on the second metal layer, and being coupled to the second pass-gate transistor and the fourth pass-gate transistor.

18. The dual-port memory cell of claim 17, wherein the first word line is configured to supply a first word line signal of the first port, and the first word line comprises:

a fifth conductor extending in the first direction, being coupled to the first pass-gate transistor, and being on the first metal layer; and a sixth conductor extending in the first direction, being coupled to the third pass-gate transistor, being on the first metal layer, and being separated from the fifth conductor in the second direction.

19. The dual-port memory cell of claim 18, wherein the second word line is configured to supply a second word line signal of the second port, and the second word line comprises:

a seventh conductor extending in the first direction, being coupled to the second pass-gate transistor, and being on the second metal layer; and an eighth conductor extending in the first direction, being coupled to the fourth pass-gate transistor, being on the second metal layer, and being separated from the seventh conductor in the second direction.

20. A method of fabricating a dual-port memory cell, the method comprising:

fabricating a first set of transistors and a second set of transistors in a front-side of a substrate, the first set of transistors being stacked above the second set of transistors, the first set of transistors including a first pass-gate transistor and a second pass-gate transistor that correspond to a first port of the dual-port memory cell, the second set of transistors including a third pass-gate transistor and a fourth pass-gate transistor that correspond to a second port of the dual-port memory cell;

fabricating a first set of vias on the front-side of the substrate, the first set of vias being electrically coupled to at least the first set of transistors;

depositing a first conductive material on the front-side of the substrate on a first metal level thereby forming a first set of conductors, the first set of conductors being electrically coupled to at least the first set of transistors by the first set of vias, the first set of conductors including at least a first word line of the first port, a first bit line of the first port or a first bit line bar of the first port;

performing thinning on a back-side of the substrate opposite from the front-side;

fabricating a second set of vias on the back-side of the thinned substrate, the second set of vias being electrically coupled to at least the second set of transistors; and depositing a second conductive material on the back-side of the thinned substrate on a second metal level thereby forming a second set of conductors, the second set of conductors being electrically coupled to at least the second set of transistors by the second set of vias, the second set of conductors including at least a second word line of the second port, a second bit line of the second port or a second bit line bar of the second port.

* * * * *